United States Patent [19]

Schouhamer Immink

[11] Patent Number: 5,790,056
[45] Date of Patent: Aug. 4, 1998

[54] METHOD OF CONVERTING A SERIES OF M-BIT INFORMATION WORDS TO A MODULATED SIGNAL, METHOD OF PRODUCING A RECORD CARRIER, CODING DEVICE, DEVICE, RECORDING DEVICE, SIGNAL, AS WELL AS A RECORD CARRIER

[75] Inventor: Kornelis A. Schouhamer Immink, Eindhoven, Netherlands

[73] Assignee: U.S. Philips Corporation, New York, N.Y.

[21] Appl. No.: 706,048

[22] Filed: Aug. 30, 1996

[30] Foreign Application Priority Data

Sep. 1, 1995 [EP] European Pat. Off. ............ 95202367

[51] Int. Cl.[6] ............................................. H03M 5/00
[52] U.S. Cl. ........................................ 341/58; 341/59
[58] Field of Search ........................... 341/58, 51, 102, 341/59; 360/40

[56] References Cited

FOREIGN PATENT DOCUMENTS

WO 9522802  8/1995  WIPO .

*Primary Examiner*—Jeffrey A. Gaffin
*Assistant Examiner*—Jason L. W. Kost
*Attorney, Agent, or Firm*—Edward Blocker

[57] ABSTRACT

A method of converting a series of m-bit information words to a modulated signal. For each information word from the series an n-bit code word is delivered. The delivered code words are converted to the modulated signal. The code words are distributed over at least one group of a first type and at least one group of a second type. For the delivery of each of the code words belonging to the group of the first type the associated group establishes a coding state of the first type. When each of the code words belonging to the group of the second type is delivered, a coding state of the second type is established which is determined by an information word belonging to the delivered code word. When one of the code words is assigned to the received information word, this code word is selected from a set of code words based on the coding state. The sets of code words belonging to the coding states of the second type are disjunct. The DC and LF parameters of the modulated signal improve when in a coding state of the first type, by assigning a code word from a set of another state of the first type, while maintaining the dk-constraint. Selecting one of the sets of the first type results in the best momentary running DC value. The method can be applied to different coding state mechanisms.

12 Claims, 38 Drawing Sheets

FIG. 7-1

|    | $v_1$            |   | $v_2$            |   | $v_3$            |   | $v_4$            |   |
|----|------------------|---|------------------|---|------------------|---|------------------|---|
| 21 | 0001000000010000 | 2 | 1001000010010001 | 1 | 0100000000000001 | 1 | 0001000000010000 | 2 |
| 22 | 0001000000100000 | 2 | 1001000010000001 | 1 | 0100000000010000 | 1 | 0001000000100000 | 2 |
| 23 | 0001000001000100 | 2 | 1001000100010001 | 1 | 0100000000100001 | 1 | 0001000001000100 | 2 |
| 24 | 0001000010000000 | 2 | 1001000100100001 | 1 | 0100000001000001 | 1 | 0001000010000000 | 2 |
| 25 | 0001000010000100 | 2 | 1001001000010001 | 1 | 0100000010000001 | 1 | 0001000010000100 | 2 |
| 26 | 0001000010001000 | 2 | 1001001000100001 | 1 | 0100000100000001 | 1 | 0001000100000100 | 2 |
| 27 | 0001000100000000 | 2 | 1001001001000001 | 1 | 0100000100010001 | 1 | 0001000100001000 | 2 |
| 28 | 0001000100000100 | 2 | 0010000000000001 | 1 | 0100000100100001 | 1 | 0001000100100000 | 2 |
| 29 | 0001000100001000 | 2 | 0010000000010001 | 1 | 0100000100100001 | 1 | 0001001000000100 | 2 |
| 30 | 0001001000000000 | 2 | 0010000001000001 | 1 | 0100000100000001 | 1 | 0001001000010000 | 2 |
| 31 | 0001001000010000 | 2 | 0010000010000001 | 1 | 0100000100100001 | 1 | 0001001000100000 | 2 |
| 32 | 0001001000100000 | 2 | 0010000010010001 | 1 | 0100001000010001 | 1 | 0001001001000100 | 2 |
| 33 | 0001001001000100 | 2 | 0010000100000001 | 1 | 0100001000100001 | 1 | 0001001001000100 | 2 |
| 34 | 0001001001000100 | 2 | 0010000100010001 | 1 | 0100001001000001 | 1 | 0001001000000100 | 2 |
| 35 | 0001001000000100 | 2 | 0010000100100001 | 1 | 0100010000000001 | 1 | 0001000100001000 | 2 |
| 36 | 0001000100001000 | 2 | 0010000101000001 | 1 | 0100010000010001 | 1 | 0001000100100000 | 2 |
| 37 | 0001000100100000 | 2 | 0010001000000001 | 1 | 0100010001000001 | 1 | 0001000000010000 | 2 |
| 38 | 0001000000010000 | 2 | 0010001000010001 | 1 | 0100010010000001 | 1 | 0001000000100000 | 2 |
| 39 | 0010000000000000 | 2 | 0010001000100001 | 1 | 0100100000010001 | 1 | 0010000000000000 | 2 |
| 40 | 0010000000000000 | 2 | 0010001001000001 | 1 | 0100100000100001 | 1 | 0010000000100000 | 2 |
| 41 | 0010000000100000 | 2 | 0010010000000001 | 1 | 0100100010000001 | 1 | 0010000000100100 | 2 |

FIG.7-2

| | $v_1$ | | $v_2$ | | $v_3$ | | $v_4$ | |
|---|---|---|---|---|---|---|---|---|
| | | 2 | | 2 | | 2 | | 2 |
| 42 | 0010000010000000 | 2 | 0010010000001001 | 2 | 0100100010001001 | 1 | 0010000010000000 | 2 |
| 43 | 0010000010000100 | 2 | 0010010000010001 | 2 | 0100100100000001 | 1 | 0010000010000100 | 2 |
| 44 | 0010000001001000 | 2 | 0010010001000001 | 2 | 0100100100010001 | 1 | 0010000010001000 | 2 |
| 45 | 0010000100000000 | 2 | 0010010010000001 | 2 | 0100100100100001 | 1 | 0010000010000000 | 2 |
| 46 | 0010000100000100 | 2 | 0010010010001001 | 2 | 0100100110010001 | 1 | 0010000100000100 | 2 |
| 47 | 0010000100001000 | 2 | 0000000000000100 | 2 | 0000001000000100 | 2 | 0010000100001000 | 2 |
| 48 | 0010000100010000 | 2 | 0000000000001000 | 2 | 0000001000001000 | 2 | 0010000100010000 | 2 |
| 49 | 0010000100100000 | 2 | 0000000000010000 | 2 | 0000001000010000 | 2 | 0010000100000000 | 2 |
| 50 | 0010000100000000 | 2 | 0000000000100000 | 2 | 0000001001000000 | 2 | 0010000100000000 | 2 |
| 51 | 0010001000000000 | 2 | 0000000001000000 | 2 | 0000001001100000 | 2 | 0010000100000000 | 2 |
| 52 | 0010001000000100 | 2 | 0000000001000100 | 2 | 0000001001000100 | 2 | 0010000100000100 | 2 |
| 53 | 0010001000001000 | 2 | 0000000010000000 | 2 | 0000010000000000 | 2 | 0010000100001000 | 2 |
| 54 | 0010001000010000 | 2 | 0000000010001000 | 2 | 0000010000001000 | 2 | 0010001000010000 | 2 |
| 55 | 0010001000000100 | 2 | 0000000010000100 | 2 | 0000010000100100 | 2 | 0010001000000100 | 2 |
| 56 | 0010001000010000 | 2 | 0000000100000000 | 2 | 0000010001000000 | 2 | 0010001000010000 | 2 |
| 57 | 0010001000100000 | 2 | 0000000100000100 | 2 | 0000010001000100 | 2 | 0010001000000000 | 2 |
| 58 | 0010001001000000 | 2 | 0000000100001000 | 2 | 0000010001001000 | 2 | 0010001000000100 | 2 |
| 59 | 0010010000000100 | 2 | 0000000100010000 | 2 | 0000010010010000 | 2 | 0010010000000100 | 2 |
| 60 | 0010010001000000 | 2 | 0000001000000000 | 2 | 0000010010000000 | 2 | 0010010000100000 | 2 |
| 61 | 0010010001000100 | 2 | 0000001000001000 | 2 | 0000100000001000 | 2 | 0010010001000100 | 2 |
| 62 | 0010010001001000 | 2 | 0000001000010000 | 2 | 0000100000010000 | 2 | 0010010001001000 | 2 |

|  | $v_1$ |  | $v_2$ |  | $v_3$ |  | $v_4$ |
|---|---|---|---|---|---|---|---|
| 105 | 3 00100100100001000100 | 2 00100000000010000 | 2 010000100001000010000 | 3 00100100100001000100 |
| 106 | 3 00010010010001001000 | 2 00100000000100000 | 2 010000100010000100000 | 3 00010010010001001000 |
| 107 | 4 00001000000000000000 | 2 00100000000001000 | 2 010000100000000001000 | 4 00001000000000000000 |
| 108 | 4 00001000000000000010 | 2 00100000001000000 | 2 010000100100000000000 | 4 00001000000000000010 |
| 109 | 4 00001000000100010 | 2 00100000010000000 | 2 010000100000000000100 | 4 00001000000000100010 |
| 110 | 4 00001000001000010 | 2 00100000010000000 | 2 010000100000010000000 | 4 00001000001000000010 |
| 111 | 4 00001000010000010 | 2 00100001000000000 | 2 010000100000100000000 | 4 00001000010000000010 |
| 112 | 4 00001000100001010 | 2 00100001000000100 | 2 010000100001000100000 | 4 00001000100001000010 |
| 113 | 4 00001000100010010 | 2 00100001000001000 | 2 010000100000001000000 | 4 00001000100010000010 |
| 114 | 4 00001000000000010 | 2 00100001000010000 | 2 010000100000000100000 | 4 00001000000000010010 |
| 115 | 4 00001000100000010 | 2 00100010000000000 | 2 010000100010001000000 | 4 00001000100000000010 |
| 116 | 4 00001000100100010 | 2 00100010000000100 | 2 010000100000000010000 | 4 00001000100100000010 |
| 117 | 4 00001000000000010 | 2 00100010000001000 | 2 010000100000000100000 | 4 00001000000000100010 |
| 118 | 4 00001000100000010 | 2 00100010000010000 | 2 010000100000010000000 | 4 00001000000001000010 |
| 119 | 4 00001000100001010 | 2 00100010000100000 | 2 010000100000100000000 | 4 00001000100001000010 |
| 120 | 4 00001000100010010 | 2 00100010001000000 | 2 010000100001000000000 | 4 00001000001000000010 |
| 121 | 4 00001000000000010 | 2 00100100000010000 | 2 010000100000000010000 | 4 00001000010000000010 |
| 122 | 4 00001000100000010 | 2 00100100000100000 | 2 010000100000000100000 | 4 00001000100000100010 |
| 123 | 4 00001000100100010 | 2 00100100000001000 | 2 010000100010000000000 | 4 00001000100010000010 |
| 124 | 4 00001000000100010 | 2 00100100000100000 | 2 010000100000010000000 | 4 00001000000100100010 |
| 125 | 4 00001000100000010 | 2 00100100000100000 | 2 010000100100000000000 | 4 00001000100000100010 |

| | $v_1$ | | $v_2$ | | $v_3$ | | $v_4$ | |
|---|---|---|---|---|---|---|---|---|
| 126 | 0010010000000000 | 4 | 0010010010000000 | 4 | 0100010010001000 | 2 | 0010010000000000 | 4 |
| 127 | 0010010000000010 | 4 | 0010010010000100 | 4 | 0100010010010000 | 2 | 0010010000000010 | 4 |
| 128 | 0010010000100010 | 4 | 0010010010001000 | 4 | 0000010010000000 | 2 | 0010010000100010 | 4 |
| 129 | 0010010010000010 | 4 | 0010010000010000 | 4 | 0000000010000000 | 3 | 0010010000100010 | 4 |
| 130 | 0010010010000010 | 4 | 1000000000010000 | 4 | 0000000100000000 | 3 | 0100010001000010 | 4 |
| 131 | 0000010000100000 | 3 | 1000000000000100 | 3 | 0000000100001000 | 3 | 0100010010001001 | 1 |
| 132 | 0000000000100000 | 3 | 1000000000100100 | 3 | 0000000100001000 | 3 | 0100010010000100 | 3 |
| 133 | 0000000000000000 | 3 | 1000000001000000 | 3 | 0000000100010000 | 3 | 0100010000000100 | 3 |
| 134 | 0000000000010000 | 3 | 1000000000010000 | 3 | 0000000100010000 | 3 | 0100000000010000 | 3 |
| 135 | 0000000000100000 | 3 | 1000000000000100 | 3 | 0000010100000000 | 3 | 0100000000001000 | 3 |
| 136 | 0000000010001000 | 3 | 1000000000100000 | 3 | 0000010100000000 | 3 | 0100000000000100 | 3 |
| 137 | 0000000100000000 | 3 | 1000000001000000 | 3 | 0000000100001000 | 3 | 0100000000010000 | 3 |
| 138 | 0000000100000000 | 3 | 1000000001000100 | 3 | 0000000101000000 | 3 | 0100000000100000 | 3 |
| 139 | 0000000100010000 | 3 | 1000000001000000 | 3 | 0000000100100000 | 3 | 0100000001000000 | 3 |
| 140 | 0000000100010000 | 3 | 1000000000010000 | 3 | 0000000100010000 | 3 | 0100000000100000 | 3 |
| 141 | 0000010010000000 | 3 | 1000000010000100 | 3 | 0000010010000000 | 3 | 0100000001000100 | 3 |
| 142 | 0000010100000000 | 3 | 1000000010000000 | 3 | 0000010000001000 | 3 | 0100000000001000 | 3 |
| 143 | 0000001100000000 | 3 | 1000000001000000 | 3 | 0000010000000000 | 3 | 0100000001000010 | 3 |
| 144 | 0000001100010000 | 3 | 1000000001000000 | 3 | 0000010000100000 | 3 | 0100000001000000 | 3 |
| 145 | 0000001100100000 | 3 | 1000000100000000 | 3 | 0000010000100000 | 3 | 0100000100000000 | 3 |
| 146 | 0000001100100100 | 3 | 1000000100100100 | 3 | 0000010000100100 | 3 | 0100000010000000 | 3 |

FIG. 7–7

| | $v_1$ | | $v_2$ | | $v_3$ | | $v_4$ | |
|---|---|---|---|---|---|---|---|---|
| 147 | 0000010000000100 | 3 | 1000010000000100 | 3 | 0000100001000000 | 3 | 0100010000000100 | 3 |
| 148 | 0000010000001000 | 3 | 1000010000001000 | 3 | 0000100001000100 | 3 | 0100010000001000 | 3 |
| 149 | 0000010000010000 | 3 | 1000010000010000 | 3 | 0000100001001000 | 3 | 0100010000010000 | 3 |
| 150 | 0000010000100000 | 3 | 1000010000100000 | 3 | 0000100001010000 | 3 | 0100010000100000 | 3 |
| 151 | 0000010001000000 | 3 | 1000010001000000 | 3 | 0000100001100000 | 3 | 0100010001000000 | 3 |
| 152 | 0000010001000100 | 3 | 1000010001000100 | 3 | 0000100010000000 | 3 | 0100010001000100 | 3 |
| 153 | 0000010001001000 | 3 | 1000010001001000 | 3 | 0000100010000100 | 3 | 0100010001001000 | 3 |
| 154 | 0000010001010000 | 3 | 1000010001010000 | 3 | 0000100010001000 | 3 | 0100010001010000 | 3 |
| 155 | 0000010001100000 | 3 | 1000010001100000 | 3 | 0000100010010000 | 3 | 0100010001100000 | 3 |
| 156 | 0000010010000000 | 3 | 1000010010000000 | 3 | 0000100010100000 | 3 | 0100010010000000 | 3 |
| 157 | 0000010010000100 | 3 | 1000010010000100 | 3 | 0000100011000000 | 3 | 0100010010000100 | 3 |
| 158 | 0000010010001000 | 3 | 1000010010001000 | 3 | 0000100100000000 | 3 | 0100010010001000 | 3 |
| 159 | 0000010010010000 | 3 | 1000010010010000 | 3 | 0000100100000100 | 3 | 0100010010010000 | 3 |
| 160 | 0000010010100000 | 3 | 1000010010100000 | 3 | 0000100100001000 | 3 | 0100010010100000 | 3 |
| 161 | 0000010011000000 | 3 | 1000010011000000 | 3 | 0000100100010000 | 3 | 0100010011000000 | 3 |
| 162 | 0000010100000000 | 3 | 1000010100000000 | 3 | 0000100100100000 | 3 | 0100010100000000 | 3 |
| 163 | 0000010100000100 | 3 | 1000010100000100 | 3 | 0000100101000000 | 3 | 0100010100000100 | 3 |
| 164 | 0000010100001000 | 3 | 1000010100001000 | 3 | 0000100110000000 | 3 | 0100010100001000 | 3 |
| 165 | 0000010100010000 | 3 | 1000010100010000 | 3 | 0000100110010000 | 3 | 0100010100010000 | 3 |
| 166 | 0000010100100000 | 3 | 1000010100100000 | 3 | 0000100110100000 | 3 | 0100010100100000 | 3 |
| 167 | 0000010100100100 | 2 | 1001000000000100 | 2 | 0001001000000100 | 3 | 0100000100001000 | 2 |

FIG. 7-8

| | $v_1$ | | $v_2$ | | $v_3$ | | $v_4$ | |
|---|---|---|---|---|---|---|---|---|
| 168 | 0000000100100100 | 2 | 1001000000001000 | 3 | 0001001000001000 | 3 | 0100000100000000 | 2 |
| 169 | 0000001000000100 | 2 | 1001000000010000 | 3 | 0001001000010000 | 3 | 0100000100010000 | 2 |
| 170 | 0000010000001000 | 2 | 1001000000100000 | 3 | 0001001000100000 | 3 | 0100000100000100 | 2 |
| 171 | 0000100000010000 | 2 | 1001000001000000 | 3 | 0001001001000000 | 3 | 0100000100001000 | 2 |
| 172 | 0000000001000000 | 2 | 1001000010000000 | 3 | 0001001010000000 | 3 | 0100000100010000 | 2 |
| 173 | 0000000010000100 | 2 | 1001000100000000 | 3 | 0100000000000100 | 3 | 0100000000000100 | 2 |
| 174 | 0000000100001000 | 2 | 1001001000000000 | 3 | 0100000000001000 | 3 | 0100000000000100 | 2 |
| 175 | 0000001000010000 | 2 | 1001000000000100 | 3 | 0100000000010000 | 3 | 0100000000100000 | 2 |
| 176 | 0000100000000100 | 2 | 1001000010000000 | 3 | 0100000000100000 | 3 | 0100000000000100 | 2 |
| 177 | 0000100000000100 | 2 | 1001001000000100 | 3 | 0100000001000000 | 3 | 0100000001000000 | 2 |
| 178 | 0000100000001000 | 2 | 1001001000001000 | 3 | 0100000010000000 | 3 | 0100000010000000 | 2 |
| 179 | 0000100000010000 | 2 | 1001000000000100 | 3 | 0100000100000000 | 3 | 0100000000100000 | 2 |
| 180 | 0000100000100000 | 2 | 1001001000010000 | 3 | 0100000000100000 | 3 | 0100000000001000 | 2 |
| 181 | 0000100001000000 | 2 | 1001001000100000 | 3 | 0100000000010000 | 3 | 0100000100000000 | 2 |
| 182 | 0000100001000000 | 2 | 1001001001000000 | 3 | 0100000100000100 | 3 | 0100000100000000 | 2 |
| 183 | 0000100010000000 | 2 | 1001001010000000 | 3 | 0100000100001000 | 3 | 0100000000010000 | 2 |
| 184 | 0000100100000100 | 2 | 1001001000000000 | 3 | 0100000100010000 | 3 | 0100000000001000 | 2 |
| 185 | 0000100100001000 | 2 | 0010000000010000 | 3 | 0100000100000000 | 3 | 0100000100000000 | 2 |
| 186 | 0000100100010000 | 2 | 0010000000010000 | 3 | 0100000100000000 | 3 | 0100000100000100 | 2 |
| 187 | 0000100100100000 | 2 | 0010000000100000 | 3 | 0100000100000100 | 3 | 0100000100001000 | 2 |
| 188 | 0000100101000000 | 2 | 0010000001000000 | 3 | 0100000100000000 | 3 | 0100000010001000 | 2 |
| 189 | 0000000010000001 | 1 | 0010000000100100 | 3 | 0100000100100100 | 3 | 0100000000100000 | 1 |

| | $v_1$ | | $v_2$ | | $v_3$ | | $v_4$ |
|---|---|---|---|---|---|---|---|
| 190 | 0000000001001001 | 1 | 0010000001000000 | 3 | 0100010000000100 | 3 | 0100000010001001 |
| 191 | 0000000010000001 | 1 | 0010000010001000 | 3 | 0100010000001000 | 3 | 0100000100000001 |
| 192 | 0000000010010001 | 1 | 0010000010010000 | 3 | 0100010000010000 | 3 | 0100000100010001 |
| 193 | 0000000100010001 | 1 | 0010000100000000 | 3 | 0100010000100000 | 3 | 0100000100010001 |
| 194 | 0000000100100001 | 1 | 0010000100001000 | 3 | 0100010001000000 | 3 | 0100000100100001 |
| 195 | 0000000101000001 | 1 | 0010000100010000 | 3 | 0100010010000000 | 3 | 0100001000000001 |
| 196 | 0000001000010001 | 1 | 0010000100100000 | 3 | 0100010100000000 | 3 | 0100001000010001 |
| 197 | 0000001000100001 | 1 | 0010000101000000 | 3 | 0100011000000000 | 3 | 0100001000100001 |
| 198 | 0000001001000001 | 1 | 0010000110000000 | 3 | 0100100000000100 | 3 | 0100001001000001 |
| 199 | 0000001010000001 | 1 | 0010001000000100 | 3 | 0100100000001000 | 3 | 0100010000100001 |
| 200 | 0000001100000001 | 1 | 0010001000001000 | 3 | 0100100000010000 | 3 | 0100010001000001 |
| 201 | 0000010000010001 | 1 | 0010001000010000 | 3 | 0100100000100000 | 3 | 0100010010000001 |
| 202 | 0000010000100001 | 1 | 0010001000100000 | 3 | 0100100001000000 | 3 | 0100010100000001 |
| 203 | 0000010001000001 | 1 | 0010001001000000 | 3 | 0100100010000000 | 3 | 0100011000000001 |
| 204 | 0000010010000001 | 1 | 0010001010000000 | 3 | 0100100100000000 | 3 | 0100100010000001 |
| 205 | 0000010100000001 | 1 | 0010001100000000 | 3 | 0100101000000000 | 3 | 0100100100000001 |
| 206 | 0000011000000001 | 1 | 0010010000000100 | 3 | 0100110000000000 | 3 | 0100101000000001 |
| 207 | 0000100000010001 | 1 | 0010010000001000 | 3 | 0101000000001000 | 3 | 0100110000000001 |
| 208 | 0000100000100001 | 1 | 0010010000010000 | 3 | 0101000000010000 | 3 | 0101000000000001 |
| 209 | 0000100001000001 | 1 | 0010010000100000 | 3 | 0101000000100000 | 4 | 0110000000000001 |
| 210 | 0000100010000001 | 1 | 0010010001000000 | 3 | 0000001000000010 | 4 | 0100000100000010 |
| 211 | 0000000000000010 | 4 | 1000000000000010 | 4 | 0000010000100010 | 4 | 0100000000000010 |

| | $v_1$ | | $v_2$ | | $v_3$ | | $v_4$ | |
|---|---|---|---|---|---|---|---|---|
| 212 | 0000000000010010 | 4 | 1000000000010010 | 4 | 0000001001001000 | 4 | 0100000000100010 | 4 |
| 213 | 0000000000001000 | 4 | 1000000000001000 | 4 | 0000010000010000 | 4 | 0100000001000010 | 4 |
| 214 | 0000000000100010 | 4 | 1000000000100010 | 4 | 0000010000000010 | 4 | 0100000010000010 | 4 |
| 215 | 0000000100000010 | 4 | 1000000100010010 | 4 | 0000010010000010 | 4 | 0100000010000010 | 4 |
| 216 | 0000000100000010 | 4 | 1000000100000010 | 4 | 0000010010000010 | 4 | 0100000100010010 | 4 |
| 217 | 0000000100100010 | 4 | 1000000100100010 | 4 | 0000010001000010 | 4 | 0100000100100010 | 4 |
| 218 | 0000001000100010 | 4 | 1000001000100010 | 4 | 0000010000000010 | 4 | 0100001000010010 | 4 |
| 219 | 0000001000000000 | 4 | 1000001000000000 | 4 | 0000010000000010 | 4 | 0100001000100010 | 4 |
| 220 | 0000001000000010 | 4 | 1000001000000010 | 4 | 0000100000010010 | 4 | 0100001000000010 | 4 |
| 221 | 0000010000100010 | 4 | 1000010000100010 | 4 | 0000100001000010 | 4 | 0100010000100010 | 4 |
| 222 | 0000010000000010 | 4 | 1000010000000010 | 4 | 0000100000000010 | 4 | 0100010000000010 | 4 |
| 223 | 0000010001000010 | 4 | 1000010001000010 | 4 | 0000100100100010 | 4 | 0100010001000010 | 4 |
| 224 | 0000010010000010 | 4 | 1000010010000010 | 4 | 0000100100000000 | 4 | 0100010010000000 | 4 |
| 225 | 0000010100000010 | 4 | 1000010100000010 | 4 | 0000100000000010 | 4 | 0100010000000010 | 4 |
| 226 | 0000100000000010 | 4 | 1000100000000010 | 4 | 0000100000100010 | 4 | 0100100000100010 | 4 |
| 227 | 0000100000100010 | 4 | 1000100000100010 | 4 | 0000100000001010 | 4 | 0100100000001010 | 4 |
| 228 | 0000100001000010 | 4 | 1000100001000010 | 4 | 0000100001000010 | 4 | 0100100001000010 | 4 |
| 229 | 0000100010000010 | 4 | 1000100010000010 | 4 | 0000100010000010 | 4 | 0100100010000010 | 4 |
| 230 | 0000100100000010 | 4 | 1000100100000010 | 4 | 0000100100000010 | 4 | 0100100100000010 | 4 |
| 231 | 0000100100010010 | 4 | 1000100100010010 | 4 | 0000100100010010 | 4 | 0100100100010010 | 4 |
| 232 | 0000100100001001 | 1 | 1001000000000000 | 1 | 0000100100000000 | 4 | 0100100000000001 | 1 |
| 233 | 0000100100010001 | 1 | 1001000000010001 | 1 | 0000100100010010 | 4 | 0100100100010001 | 1 |

|  | $v_1$ |  | $v_2$ |  | $v_3$ |  | $v_4$ |  |
|---|---|---|---|---|---|---|---|---|
| 234 | 1 | 0000000000000001 | 1 | 1001000000010010 | 4 | 0001001000100010 | 1 | 0100010010010001 |
| 235 | 1 | 0000000000001001 | 1 | 1001000000100010 | 4 | 0100000000000010 | 1 | 0100000000010001 |
| 236 | 1 | 0000000000010001 | 1 | 1001000001000010 | 4 | 0100000000100010 | 1 | 0100000000100001 |
| 237 | 1 | 0000000000100001 | 1 | 1001000010000010 | 4 | 0100000001000010 | 3 | 0100100001001000 |
| 238 | 1 | 0000000000000100 | 1 | 1001000100000010 | 4 | 0100000010000010 | 2 | 0100100100010000 |
| 239 | 1 | 0000000000001000 | 2 | 1001001000000010 | 4 | 0100000100000010 | 2 | 0100100100100000 |
| 240 | 1 | 0000000000010000 | 2 | 1001010000000010 | 4 | 0100001000000010 | 2 | 0100100001000000 |
| 241 | 1 | 0000000000100000 | 2 | 1001100000000010 | 4 | 0100010000000010 | 2 | 0100100010000000 |
| 242 | 1 | 0000000001000000 | 2 | 1010000000000010 | 4 | 0100100000000010 | 2 | 0100100100000000 |
| 243 | 1 | 0000000010000000 | 2 | 1100000000000010 | 4 | 0100000000000000 | 2 | 0100001000000100 |
| 244 | 1 | 0000000100000000 | 2 | 0001000000000010 | 4 | 0100100000000000 | 2 | 0100100000000100 |
| 245 | 1 | 0000001000000000 | 2 | 0010000000000010 | 4 | 0100010000000000 | 2 | 0100010000000100 |
| 246 | 1 | 0000010000000000 | 2 | 0010000000100010 | 4 | 0100001000000000 | 2 | 0100001000000000 |
| 247 | 1 | 0000100000000000 | 2 | 0010000001000010 | 4 | 0100000100000000 | 2 | 0100000100000000 |
| 248 | 1 | 0001000000000000 | 2 | 0010000010000010 | 4 | 0100000010000000 | 2 | 0100000010000000 |
| 249 | 1 | 0000000100010000 | 2 | 0010000100000010 | 4 | 0100000001000000 | 2 | 0100000001000000 |
| 250 | 1 | 0000000100100000 | 2 | 0010001000000010 | 4 | 0100000000100000 | 2 | 0100000000100000 |
| 251 | 1 | 0000000001000100 | 2 | 0010010000000010 | 4 | 0100000000010000 | 2 | 0100000000010000 |
| 252 | 1 | 0000000010001000 | 2 | 0010100000000010 | 4 | 0100000000001000 | 2 | 0100000000001000 |
| 253 | 1 | 0000000000100100 | 2 | 0010100010000010 | 4 | 0100100010000000 | 2 | 0100100100000000 |
| 254 | 1 | 0000000010010000 | 3 | 0011000000000010 | 4 | 0100100100000000 | 3 | 0100100010000000 |
| 255 | 1 | 0000000001001000 | 3 | 0010010010000010 | 4 | 0100010010000010 | 3 | 0100100100000100 |

FIG.8a-1

| | $v_1$ | | $v_2$ | | $v_3$ | | $v_4$ | |
|---|---|---|---|---|---|---|---|---|
| 16 | 0010000010010001 | 1 | 0010000010010001 | 1 | 1000000100100001 | 1 | 1000000100100001 | 1 |
| 17 | 1000000000100010 | 1 | 0010000000100010 | 1 | 1000000100100000 | 4 | 1000000100100000 | 4 |
| 18 | 0001000000001001 | 1 | 0100000010010000 | 2 | 0001000000001001 | 1 | 0100000100001000 | 2 |
| 19 | 0010000000010001 | 1 | 0010000000010001 | 1 | 1001001000000000 | 4 | 1001001000000000 | 4 |
| 20 | 0001000000010010 | 1 | 0001000000010010 | 1 | 1000100010000000 | 4 | 1000100010000000 | 4 |
| 21 | 0000100000000010 | 1 | 0000100000000010 | 1 | 1000000100010001 | 1 | 1000000100010001 | 1 |
| 22 | 0000100000000001 | 1 | 0000100000000001 | 1 | 1000000010001001 | 1 | 1000000010001001 | 1 |
| 23 | 0010001000100000 | 2 | 0010001000100000 | 2 | 1000000001001000 | 2 | 1000000001001000 | 2 |
| 24 | 0010000100010000 | 2 | 0010000100010000 | 2 | 1000000001001000 | 3 | 1000000001001000 | 3 |
| 25 | 0010000010001000 | 2 | 0010000000100100 | 2 | 0010000100010000 | 2 | 0010000000100100 | 2 |
| 26 | 0010000001000100 | 2 | 0010000001000100 | 2 | 0010000010001000 | 1 | 0010000010000100 | 1 |
| 27 | 0010000001000010 | 2 | 0010000001000100 | 3 | 0100000000010001 | 2 | 0100000000010001 | 2 |
| 28 | 0010000000001000 | 2 | 0001000100010000 | 2 | 0010010000001000 | 1 | 0010010000001000 | 1 |
| 29 | 0001000000001000 | 2 | 0001000010010000 | 3 | 1001001000010000 | 2 | 0100100010000010 | 2 |
| 30 | 0001000001001000 | 2 | 0001001000100000 | 3 | 0001000001001000 | 2 | 0100100010010000 | 3 |
| 31 | 0001000000100100 | 2 | 0001000000100100 | 2 | 1001000100000001 | 1 | 1001000100000001 | 1 |

FIG. 8a–2

| # | $v_1$ | | $v_2$ | | $v_3$ | | $v_4$ | |
|---|---|---|---|---|---|---|---|---|
| 32 | 0001000000000100 | 2 | 0001000000000100 | 2 | 1000100100000010 | 1 | 1000100100000010 | 1 |
| 33 | 0001000000000100 | 3 | 0001000000000100 | 3 | 1000100010000001 | 1 | 1000100010000001 | 1 |
| 34 | 0001000000100100 | 3 | 0001000000100100 | 3 | 1000000000100100 | 2 | 0100000000100100 | 2 |
| 35 | 0001000001001000 | 3 | 0100000100001000 | 3 | 0001000010001000 | 3 | 1000010010000000 | 4 |
| 36 | 0001000100010000 | 3 | 0001000100010000 | 3 | 1000000000100100 | 3 | 1000010001000100 | 3 |
| 37 | 0001000100100000 | 3 | 0001000100100000 | 3 | 1000000100010000 | 4 | 1000010001000000 | 4 |
| 38 | 0010000000001000 | 3 | 0101000100000001 | 3 | 0010000000001000 | 3 | 0100000100000000 | 1 |
| 39 | 0010000001000100 | 3 | 0010000001000100 | 3 | 1001000010000000 | 4 | 1001000100000001 | 4 |
| 40 | 0010000010001000 | 3 | 0010000100010000 | 3 | 0010000100001000 | 3 | 1000000100010000 | 1 |
| 41 | 0010000100010000 | 3 | 0010000100010000 | 3 | 1000000100100000 | 3 | 1000000100100000 | 1 |
| 42 | 0010001000100000 | 3 | 0010001000100000 | 3 | 1000001000100000 | 4 | 1000001000100000 | 2 |
| 43 | 0100010001000000 | 4 | 0100010001000000 | 4 | 1000010001000000 | 3 | 1000010001000000 | 1 |
| 44 | 0001000100010010 | 4 | 0001000100010010 | 4 | 1000010001000010 | 1 | 1000010001000010 | 3 |
| 45 | 0000100000000001 | 1 | 0100010001000000 | 1 | 0100000100000001 | 1 | 0100000100000000 | 4 |
| 46 | 0010010010000010 | 1 | 0010010010000010 | 1 | 1000000100100001 | 1 | 1000001000100001 | 1 |
| 47 | 0100000010001001 | 1 | 0100000010000001 | 1 | 0010000100010001 | 1 | 0100000100100001 | 1 |

| | $v_1$ | | $v_2$ | | $v_3$ | | $v_4$ | |
|---|---|---|---|---|---|---|---|---|
| 48 | 00100100010000001 | 1 | 00100100010000001 | 1 | 10000001000010000 | 2 | 10000001000010000 | 2 |
| 49 | 00100100010000010 | 1 | 00100100010000010 | 1 | 10000001000001000 | 2 | 10000001000001000 | 2 |
| 50 | 00100100000100001 | 1 | 00100100000100001 | 1 | 10000001000010000 | 3 | 10000001000010000 | 3 |
| 51 | 00100100000100001 | 1 | 01000000100100001 | 1 | 00010000001001001 | 1 | 01000001001000001 | 1 |
| 52 | 00100000100100010 | 1 | 00100100100100010 | 1 | 10000001000100010 | 1 | 10000001000100010 | 1 |
| 53 | 00100000100010001 | 1 | 00100100000010001 | 1 | 10000001000010001 | 1 | 10000001000010001 | 1 |
| 54 | 00100000100010010 | 1 | 00100100010010010 | 1 | 10000001000010010 | 1 | 10000001000010010 | 1 |
| 55 | 00100000010010001 | 1 | 00100100010010001 | 1 | 10000001000010001 | 1 | 10000001000010001 | 1 |
| 56 | 00100000000100001 | 1 | 00100000001000001 | 1 | 10000000010000001 | 1 | 10000000010000010 | 1 |
| 57 | 00001000000001001 | 1 | 01000100100010001 | 1 | 01000000001001001 | 1 | 01000000010010001 | 1 |
| 58 | 00001000100100001 | 1 | 00001000100100001 | 1 | 10000000001001001 | 1 | 10000000001001001 | 1 |
| 59 | 00001000000100001 | 1 | 00001000000100001 | 1 | 10010010000010010 | 1 | 10010010000010010 | 1 |
| 60 | 00001000000100010 | 1 | 00001000000100010 | 1 | 10010010000001001 | 1 | 10010010000001001 | 1 |
| 61 | 00001000000010001 | 1 | 00001000000010001 | 1 | 10000010000010001 | 1 | 10000010000010001 | 1 |
| 62 | 00001000000000010 | 1 | 00001000000010010 | 1 | 10000010000000010 | 1 | 10000010000000010 | 1 |
| 63 | 00001000000010010 | 1 | 00001000000010010 | 1 | 10000000010000100 | 2 | 10000000010000100 | 2 |

|    | $v_1$ |   | $v_2$ |   | $v_3$ |   | $v_4$ |   |
|----|-------|---|-------|---|-------|---|-------|---|
| 64 | 0000010000100010 | 1 | 0000010000000010 | 1 | 0100000001001000 | 2 | 0100000001001000 | 2 |
| 65 | 0010010000100000 | 2 | 0010010000100000 | 2 | 1000010000100000 | 2 | 1000010000100000 | 2 |
| 66 | 0010010000010000 | 2 | 0010010000010000 | 2 | 1000010000010000 | 2 | 1000010000010000 | 2 |
| 67 | 0010000100001000 | 2 | 0100001000010000 | 2 | 0010000100001000 | 2 | 0100000000100010 | 1 |
| 68 | 0010000010000100 | 2 | 0010000000100100 | 2 | 1000001000001000 | 2 | 1000001000100100 | 2 |
| 69 | 0010000000010000 | 2 | 0100000000010000 | 2 | 1000000100000100 | 2 | 1000000100000100 | 2 |
| 70 | 0001000000001000 | 2 | 0001000001000000 | 2 | 0001000001000000 | 2 | 1000000010000100 | 2 |
| 71 | 0001001000100000 | 2 | 0001001000100000 | 2 | 0100000010001000 | 2 | 0100000010000100 | 2 |
| 72 | 0001000000001000 | 2 | 0010000100001000 | 2 | 0001000000001000 | 2 | 0100000010000010 | 2 |
| 73 | 0001000100010000 | 2 | 0001000100010000 | 2 | 1000001000000100 | 3 | 0100000001001000 | 3 |
| 74 | 0000100100001000 | 2 | 0000100100001000 | 2 | 1000000100001000 | 3 | 1000010000100000 | 3 |
| 75 | 0000100100010000 | 2 | 0000100100010000 | 2 | 1000010000010000 | 3 | 1000010000010000 | 3 |
| 76 | 0000100010000100 | 2 | 0000100010000100 | 2 | 0100000001001000 | 3 | 0100000010001000 | 3 |
| 77 | 0100001001010000 | 2 | 0100000001000100 | 2 | 1000000100001000 | 2 | 0100000100000100 | 2 |
| 78 | 0000100000100100 | 2 | 0000100000100100 | 2 | 1000000100001000 | 3 | 1000000100000100 | 3 |
| 79 | 0000100000000100 | 2 | 0000100000000100 | 2 | 1000000010000100 | 3 | 1000000010000100 | 3 |

FIG.8a-5

| | $v_1$ | | $v_2$ | | $v_3$ | | $v_4$ | |
|---|---|---|---|---|---|---|---|---|
| 80 | 0000100000000100 | 3 | 0000100000000100 | 3 | 0100000010001000 | 3 | 0100000010001000 | 3 |
| 81 | 0000100000100100 | 3 | 0000100000100100 | 3 | 1000100001000000 | 3 | 1000100001000000 | 4 |
| 82 | 0000100001001000 | 3 | 0100000001000100 | 3 | 0000100001001000 | 3 | 0100000010001000 | 3 |
| 83 | 0000100010010000 | 3 | 0000100001000100 | 3 | 1000000010001000 | 3 | 1000000010001000 | 3 |
| 84 | 0000100100100000 | 3 | 0000100100100000 | 3 | 1001001001001000 | 3 | 1001001001001000 | 2 |
| 85 | 0000100000001000 | 3 | 0100000100000100 | 3 | 0000100000010000 | 3 | 0000100000010000 | 3 |
| 86 | 0000100001000100 | 3 | 0000100001000100 | 3 | 1001001000100100 | 3 | 1001001000100100 | 2 |
| 87 | 0000100010001000 | 3 | 0100000100000100 | 3 | 0000100001001000 | 3 | 0000100001001000 | 3 |
| 88 | 0000100100010000 | 3 | 0000100100010000 | 3 | 1001001001001000 | 3 | 1001001001001000 | 3 |
| 89 | 0000100100000100 | 3 | 0000100100000100 | 3 | 1001001000000001 | 1 | 1001001000000001 | 1 |
| 90 | 0010000000010000 | 3 | 0010000000010000 | 3 | 1000100100010010 | 1 | 1000100100010010 | 1 |
| 91 | 0010000010000100 | 3 | 0010000010000100 | 3 | 1000100100001001 | 3 | 1000100100001001 | 1 |
| 92 | 0100001000001000 | 3 | 0100001000001000 | 3 | 0010000100001010 | 1 | 0100000000010001 | 1 |
| 93 | 0010001000010000 | 3 | 0010001000010000 | 3 | 1000100100000001 | 1 | 1000100000100001 | 1 |
| 94 | 0010010000100000 | 3 | 0010010000100000 | 3 | 1000010000100000 | 1 | 1000010000100000 | 1 |
| 95 | 0000001000000010 | 1 | 0100100100000010 | 1 | 1000100100100010 | 1 | 0100100100000010 | 1 |

FIG. 8a-6

| # | $v_1$ | | $v_2$ | | $v_3$ | | $v_4$ | |
|---|---|---|---|---|---|---|---|---|
| 96  | 0000000100000001 | 1 | 0100100010000001 | 1 | 1000010010001001 | 1 | 0100100010000001 | 1 |
| 97  | 0010010010001001 | 1 | 0100010000100000 | 1 | 0010010010001001 | 2 | 0100010000100000 | 2 |
| 98  | 0010010010010010 | 1 | 0010010010010010 | 2 | 1001001000000100 | 2 | 1001001000000100 | 2 |
| 99  | 0010010001000010 | 1 | 0010010010000010 | 1 | 1001001000100100 | 1 | 1001001000100100 | 3 |
| 100 | 0010010001000001 | 1 | 0100010001000010 | 1 | 1000010010000010 | 3 | 0100010001000010 | 1 |
| 101 | 0010010001001001 | 1 | 0100010010000010 | 1 | 0010010001001001 | 1 | 0100010001000001 | 1 |
| 102 | 0010010001000010 | 1 | 0010010001000010 | 1 | 1000010010000100 | 1 | 1000010010000100 | 1 |
| 103 | 0010010001000001 | 1 | 0010010001000001 | 1 | 0010010001001001 | 1 | 0010010001001001 | 1 |
| 104 | 0010010000100010 | 1 | 0010010001000010 | 1 | 1000010001000100 | 1 | 1000010001000100 | 1 |
| 105 | 0010010000100010 | 1 | 0001000100000010 | 2 | 1000010001000010 | 2 | 1000010001000010 | 2 |
| 106 | 0010000100001001 | 1 | 0010000100000001 | 1 | 0010000100001001 | 1 | 0010000100001001 | 1 |
| 107 | 0010000001000001 | 1 | 0100000001000001 | 1 | 1000000100010010 | 1 | 1000000100010010 | 1 |
| 108 | 0001001001000010 | 1 | 0001001001000010 | 1 | 1000000100000010 | 1 | 1000000100010001 | 1 |
| 109 | 0001000100000001 | 1 | 0001000100100001 | 1 | 1000000000100001 | 1 | 1000000100000001 | 1 |
| 110 | 0001001000100010 | 1 | 0001000100100010 | 1 | 1000000000100001 | 1 | 1000000001000001 | 1 |
| 111 | 0001001000100001 | 1 | 0001000100010001 | 1 | 0100000000100001 | 1 | 0100000000100001 | 1 |

FIG. 8a-7

| | $v_1$ | | $v_2$ | | $v_3$ | | $v_4$ | |
|---|---|---|---|---|---|---|---|---|
| 112 | 000100000100010 | 1 | 000100000100010 | 1 | 100100100100001 | 1 | 100100100100001 | 1 |
| 113 | 000100000010000010 | 1 | 000100000010000010 | 1 | 100100100010000010 | 1 | 100100100010000010 | 1 |
| 114 | 000100000100001 | 1 | 010001000100000 | 3 | 000100010001001 | 1 | 010001000100010 | 3 |
| 115 | 000100000000100001 | 1 | 000100010000100001 | 1 | 100100010000100001 | 1 | 100100010000100001 | 1 |
| 116 | 000010010010001 | 1 | 000010010010001 | 1 | 100100010001010 | 1 | 100100010001010 | 1 |
| 117 | 000010010001001 | 1 | 000010010001001 | 1 | 100100010001001 | 1 | 100100010001001 | 1 |
| 118 | 000010000010001 | 1 | 010001000100001 | 1 | 000010001001001 | 1 | 010001000010001 | 1 |
| 119 | 000010000100001 | 1 | 000010000100010 | 1 | 000010010010100 | 1 | 000010010010100 | 1 |
| 120 | 000010000010001 | 1 | 000010000010001 | 1 | 100010010100100 | 2 | 100010010100100 | 2 |
| 121 | 000010000001001 | 1 | 010001000001001 | 1 | 000010010000100 | 2 | 010010010000100 | 2 |
| 122 | 000010000010010 | 2 | 000010000010010 | 2 | 100100000010000 | 1 | 100100010010010 | 1 |
| 123 | 001001000100100 | 2 | 001001000100100 | 2 | 100010000100010 | 2 | 100010000100100 | 2 |
| 124 | 001001000010000 | 2 | 001001000010000 | 2 | 100010000010000 | 2 | 100010000010000 | 2 |
| 125 | 001001000010000 | 2 | 010001000100001 | 1 | 001001000010000 | 1 | 010001000010001 | 1 |
| 126 | 001001001000100 | 2 | 001001001000100 | 2 | 001001000010000 | 2 | 001001000010000 | 2 |
| 127 | 000100010001000 | 2 | 010000010001000 | 1 | 000100010001000 | 2 | 010000100010000 | 1 |

FIG. 8a-8

|     | $v_1$            |   | $v_2$            |   | $v_3$            |   | $v_4$            |   |
| --- | ---------------- | - | ---------------- | - | ---------------- | - | ---------------- | - |
| 128 | 0010000100100100 | 2 | 0010000100100100 | 2 | 1000001000001000 | 2 | 1000001000001000 | 2 |
| 129 | 0000100010001000 | 2 | 0100000100010001 | 1 | 0000010001000100 | 2 | 0100000100010001 | 1 |
| 130 | 0010000100000100 | 2 | 0010000100000100 | 2 | 1000000100100100 | 2 | 1000000100100100 | 2 |
| 131 | 0010000000100000 | 2 | 0010000000100000 | 2 | 1001001000000100 | 3 | 1001001000000100 | 3 |
| 132 | 0001001000010000 | 2 | 0001001000010000 | 2 | 1000100100000100 | 3 | 1000100100000100 | 3 |
| 133 | 0000100000001000 | 2 | 0100000100010010 | 1 | 0000100100000010 | 2 | 0100000100010010 | 1 |
| 134 | 0001000100000100 | 2 | 0001000100000100 | 2 | 1000100000000100 | 3 | 1000100000100100 | 3 |
| 135 | 0000100000010000 | 2 | 0000100000010000 | 2 | 1000010010000100 | 3 | 1000010010000100 | 3 |
| 136 | 0000100100010000 | 2 | 0000100100010000 | 2 | 1000010001000100 | 3 | 1000010001000100 | 3 |
| 137 | 0000100100010000 | 2 | 0000100000010000 | 2 | 1000010001000100 | 3 | 1000010001000100 | 3 |
| 138 | 0000100010001000 | 2 | 0100000000010010 | 1 | 0000100100001000 | 2 | 0100000000010010 | 1 |
| 139 | 0001000100010000 | 2 | 0001000100010000 | 2 | 1000010000001000 | 3 | 1000010000001000 | 3 |
| 140 | 0000100000100100 | 2 | 0000100000100100 | 2 | 1001000010000010 | 1 | 1001000010000010 | 1 |
| 141 | 0000100000000100 | 2 | 0000100000000100 | 2 | 1000000100000100 | 2 | 1000000100000100 | 2 |
| 142 | 0000100000000100 | 3 | 0000010000000100 | 3 | 1000000100100100 | 3 | 1000000100100100 | 3 |
| 143 | 0000100000100100 | 3 | 0000010000100100 | 3 | 1000000100000100 | 3 | 1000000100000100 | 3 |

FIG. 8a-9

| | $v_1$ | | $v_2$ | | $v_3$ | | $v_4$ | |
|---|---|---|---|---|---|---|---|---|
| 144 | 0000010001001000 | 3 | 0100000010000100 | 2 | 0000010001001000 | 3 | 0100000010000100 | 2 |
| 145 | 0000010010010000 | 3 | 0000010010010000 | 3 | 1001000010000000 | 4 | 1001000010000000 | 4 |
| 146 | 0000100000001000 | 3 | 0100000000010000 | 2 | 0000100000001000 | 3 | 0100000000010000 | 2 |
| 147 | 0000100000010000 | 3 | 0000100000010000 | 3 | 1000000000100000 | 2 | 1000000000100000 | 2 |
| 148 | 0000100010001000 | 3 | 0000100010001000 | 3 | 0000100010001000 | 3 | 0000100010001000 | 3 |
| 149 | 0000100100010000 | 3 | 0000100100010000 | 3 | 1000000001000000 | 3 | 1000000001000000 | 3 |
| 150 | 0001000000000100 | 3 | 0001000000000100 | 3 | 0100000100001000 | 3 | 0100000100001000 | 3 |
| 151 | 0001000010000000 | 3 | 0001000010000000 | 3 | 1000000010000000 | 4 | 1000000010000000 | 4 |
| 152 | 0001000100001000 | 3 | 0001000100001000 | 3 | 0000100001000000 | 3 | 0000100001000000 | 3 |
| 153 | 0001001000010000 | 3 | 0001001000010000 | 3 | 0001000001000000 | 1 | 0001000001000000 | 1 |
| 154 | 0010000000010000 | 3 | 0010000001000000 | 3 | 0000100010000001 | 2 | 0100000100001000 | 2 |
| 155 | 0010000100000000 | 3 | 0010000100000100 | 3 | 1001000100100100 | 3 | 1001000100100100 | 3 |
| 156 | 0010000100100000 | 3 | 0010000100100000 | 3 | 1000100100100010 | 1 | 1000100100100010 | 1 |
| 157 | 0010001000001000 | 3 | 0100000000100001 | 1 | 0010001000001000 | 3 | 0100000000100001 | 1 |
| 158 | 0010010001000100 | 3 | 0010010001000100 | 3 | 1000100100000100 | 3 | 0100010100000000 | 4 |
| 159 | 0010100000010000 | 3 | 0010010000010000 | 3 | 1000100101000100 | 2 | 1001001001001000 | 2 |

FIG. 8a-10

| | $v_1$ | | $v_2$ | | $v_3$ | | $v_4$ | |
|---|---|---|---|---|---|---|---|---|
| 160 | 0010010010000100 | 3 | 0010010010000100 | 3 | 1001001000001000 | 2 | 1001001000001000 | 2 |
| 161 | 0000010010000010 | 1 | 0100000000010000 | 3 | 1000100100010010 | 1 | 1000000000010000 | 3 |
| 162 | 0000001000001001 | 1 | 0100100100100100 | 2 | 1000100100010010 | 1 | 0100100100100100 | 2 |
| 163 | 0000000100000010 | 1 | 0100100100100100 | 3 | 1000100010001001 | 1 | 0100100100100100 | 3 |
| 164 | 0000001000000001 | 1 | 0100100100010010 | 1 | 1000100001000010 | 1 | 0100100100010010 | 1 |
| 165 | 0010010010000001 | 1 | 0010010010000010 | 1 | 1001001000100100 | 1 | 1001001000100100 | 2 |
| 166 | 0010010010010001 | 1 | 0010010010010001 | 1 | 1001001001001000 | 2 | 1001001001001000 | 2 |
| 167 | 0010010001100010 | 1 | 0010010001000100 | 2 | 1001001001000100 | 2 | 1001001000100100 | 2 |
| 168 | 0010010001001001 | 1 | 0010010000000100 | 1 | 0010010001001001 | 1 | 1001001000100100 | 1 |
| 169 | 0010010000010001 | 1 | 0010010000010001 | 1 | 1000100001000100 | 1 | 1000100100000001 | 3 |
| 170 | 0010010000001010 | 1 | 0010010000010010 | 1 | 1000100001000001 | 1 | 1000100010001001 | 1 |
| 171 | 0010010000000100 | 1 | 0010010000000010 | 1 | 1000100100001001 | 3 | 1000100010010001 | 1 |
| 172 | 0000010001000001 | 1 | 0100100010000001 | 3 | 0010010000001001 | 1 | 0100100010000001 | 1 |
| 173 | 0000010001000001 | 1 | 0001001000010010 | 1 | 1000100010001001 | 1 | 1000100010010001 | 1 |
| 174 | 0000010010000010 | 1 | 0001001001000001 | 1 | 1000010000100100 | 1 | 1000001000010001 | 1 |
| 175 | 0001001001000010 | 1 | 0001001000100010 | 1 | 1000001000100010 | 1 | 1000010000010010 | 1 |

FIG.8a-11

| | $v_1$ | | $v_2$ | | $v_3$ | | $v_4$ | |
|---|---|---|---|---|---|---|---|---|
| 176 | 000010000100000010 | 1 | 000100000100000010 | 1 | 100000100000001001 | 1 | 100001000000001001 | 1 |
| 177 | 000100100001001001 | 1 | 010010000100000010 | 1 | 000100100100001001 | 1 | 010001000010000010 | 1 |
| 178 | 000100000010000001 | 1 | 000100000010000001 | 1 | 100000010000001001 | 1 | 100000010000001001 | 1 |
| 179 | 000010010001000010 | 1 | 000010010010100010 | 1 | 100000100001000001 | 1 | 100000001000100010 | 1 |
| 180 | 000010010010001001 | 1 | 000010010001010001 | 1 | 010010010100001001 | 1 | 010001010100001001 | 1 |
| 181 | 000010000100001001 | 1 | 010010000000010000 | 1 | 000100100001001001 | 1 | 010001000100001001 | 1 |
| 182 | 000010010010010010 | 1 | 000100010010100010 | 1 | 010000100100010001 | 1 | 010000100100010001 | 1 |
| 183 | 000010000100010001 | 1 | 010000100100010001 | 1 | 000010000100010001 | 1 | 010000100100010001 | 1 |
| 184 | 000010000100100100 | 1 | 010001000100100100 | 2 | 000010010000100100 | 2 | 010001000000100100 | 1 |
| 185 | 000010000100000101 | 1 | 000000100000010001 | 3 | 001000000100001000 | 3 | 100100000010000100 | 2 |
| 186 | 000010000100010001 | 1 | 000010000100010001 | 1 | 100100001001000100 | 1 | 100100010000001000 | 2 |
| 187 | 000000100100100010 | 1 | 000000100000100010 | 1 | 100001001001000100 | 1 | 100100100000100100 | 2 |
| 188 | 000010000100001001 | 1 | 010010000100001000 | 1 | 000000100000001001 | 1 | 010001000000001001 | 1 |
| 198 | 000010010000010001 | 1 | 000000100010000001 | 1 | 100000000000010001 | 1 | 100100000000010001 | 2 |
| 190 | 000010010010001000 | 2 | 010001000100000100 | 2 | 100001001000001000 | 2 | 100001000100000100 | 2 |
| 191 | 000010001001000100 | 2 | 010001000000010000 | 2 | 100001000100000100 | 2 | 010001000001000000 | 2 |

FIG.8a-12

|     | $v_1$ |   | $v_2$ |   | $v_3$ |   | $v_4$ |   |
|-----|-------|---|-------|---|-------|---|-------|---|
| 192 | 000000100000100 | 2 | 010000100100100 | 2 | 100001000001000 | 2 | 010000100100100 | 2 |
| 193 | 001001001001000 | 2 | 010001000000010 | 3 | 001001001001000 | 2 | 010001000010000 | 3 |
| 194 | 001001000001100 | 2 | 001001001000100 | 2 | 001001001001000 | 2 | 100001001001000 | 2 |
| 195 | 001001000001000 | 2 | 010001001000010 | 1 | 001001000001000 | 1 | 010001001001000 | 1 |
| 196 | 001001000100100 | 2 | 001001000100100 | 2 | 100001000100100 | 2 | 100001001001000 | 2 |
| 197 | 001000010000100 | 2 | 001001000000100 | 2 | 100001001000100 | 2 | 100001001001000 | 2 |
| 198 | 001000100001000 | 2 | 010001000010000 | 2 | 001001001001000 | 1 | 010001000010000 | 1 |
| 199 | 001001001000100 | 2 | 001001001001000 | 2 | 010001001001000 | 2 | 010001000001000 | 2 |
| 200 | 000100100000100 | 2 | 001001000100100 | 2 | 100001000000000 | 2 | 100001001000100 | 3 |
| 201 | 000100100000100 | 2 | 001001000000100 | 2 | 000100100001000 | 3 | 100001001001000 | 3 |
| 202 | 000100001000100 | 2 | 010001000100001 | 2 | 000100100100001 | 2 | 010001000100001 | 2 |
| 203 | 000100000100100 | 2 | 000100000100100 | 2 | 001001000010000 | 2 | 100001000010000 | 3 |
| 204 | 000100001000100 | 2 | 000100001000100 | 2 | 100001001000100 | 3 | 100001001001000 | 3 |
| 205 | 000100000001000 | 2 | 000100000010000 | 2 | 000100100001000 | 3 | 100001001001000 | 3 |
| 206 | 000100100001000 | 2 | 010000100001000 | 1 | 000010010001000 | 2 | 010000100100010 | 1 |
| 207 | 000100100001000 | 2 | 010000100001000 | 2 | 000100100001000 | 1 | 010001000010001 | 1 |

FIG. 8a-13

| | $v_1$ | | $v_2$ | | $v_3$ | | $v_4$ | |
|---|---|---|---|---|---|---|---|---|
| 208 | 000001000100100 | 2 | 000001000100100 | 2 | 100000100010000 | 3 | 100000100100100 | 3 |
| 209 | 000001000000100 | 2 | 010000100010010 | 2 | 000000100000100 | 2 | 010000100010010 | 1 |
| 210 | 000000100000100 | 3 | 010000100000010 | 3 | 100010000001000 | 3 | 010000100000010 | 1 |
| 211 | 000000100100100 | 3 | 010000100100100 | 3 | 100000100101000 | 3 | 010000100100100 | 2 |
| 212 | 000001000101000 | 3 | 010000100000100 | 3 | 100000100100000 | 3 | 010000100100100 | 2 |
| 213 | 000001000000100 | 3 | 010000001000001 | 3 | 000000100000100 | 3 | 010000001000001 | 1 |
| 214 | 000001000001000 | 3 | 010001001000100 | 3 | 000010000001000 | 3 | 010000001000000 | 3 |
| 215 | 000000101000100 | 3 | 010000000100000 | 3 | 010000100001000 | 3 | 010000100001000 | 2 |
| 216 | 000000100100000 | 3 | 000000000010000 | 3 | 000000100101000 | 3 | 100010010000000 | 3 |
| 217 | 000001000010000 | 3 | 000000100000100 | 3 | 100100100010000 | 3 | 100100100000100 | 3 |
| 218 | 000100100000100 | 3 | 000100000100000 | 3 | 000100100001001 | 3 | 010000100000100 | 1 |
| 219 | 000100100000100 | 3 | 000100000100000 | 1 | 010100100001001 | 1 | 010000100001001 | 2 |
| 220 | 000100100000100 | 3 | 000100000100000 | 3 | 100100100010000 | 2 | 100100100010000 | 2 |
| 221 | 000100100100100 | 3 | 000100100100100 | 3 | 100100100001000 | 2 | 100100100001000 | 2 |
| 222 | 000100100001000 | 3 | 010000100100100 | 3 | 000100100000100 | 3 | 010000100100100 | 3 |
| 223 | 000100100010000 | 3 | 000100100100100 | 3 | 100100100000100 | 3 | 100100100000100 | 3 |

FIG.8a-14

| | $v_1$ | | $v_2$ | | $v_3$ | | $v_4$ | |
|---|---|---|---|---|---|---|---|---|
| 224 | 00100010000000100 | 3 | 00100001000000000 | 3 | 10001000000010000 | 3 | 10001000000010000 | 3 |
| 225 | 00100010001000100 | 3 | 00100010001000100 | 3 | 10010010010001010 | 1 | 10010010010001010 | 1 |
| 226 | 00100010010001000 | 3 | 01000010010001000 | 3 | 00100010010001000 | 3 | 01000010010001000 | 3 |
| 227 | 00100100010000001000 | 3 | 01001001001000000100 | 3 | 00100100010001000 | 3 | 01000100100000100 | 3 |
| 228 | 00100100010000100 | 3 | 00100100010000100 | 3 | 10010010001001000 | 3 | 10010001000010000 | 3 |
| 229 | 00100100100001000 | 3 | 01000000010000100 | 3 | 00100100100001000 | 3 | 01000010000100000 | 3 |
| 230 | 00100000100000000 | 4 | 00100000001000000 | 4 | 10010001000100001 | 1 | 10010001000100001 | 1 |
| 231 | 00100000100001001 | 1 | 01001001001000100 | 1 | 10010001000100010 | 1 | 10010001000100010 | 1 |
| 232 | 00100000100100010 | 1 | 01001001000010000 | 2 | 00100100010000100 | 1 | 01001000010000100 | 1 |
| 233 | 00100000010010001 | 1 | 01001000100001000 | 2 | 10010001000100010 | 1 | 01000010000010000 | 1 |
| 234 | 00000000100000010 | 1 | 01001000010010000 | 4 | 10010001000010001 | 1 | 01000100000010000 | 4 |
| 235 | 00000000100001000 | 1 | 01000010001000010 | 1 | 00100100001000010 | 1 | 01000100100010001 | 1 |
| 236 | 00000000010010001 | 1 | 01001000000010001 | 1 | 10010001000100001 | 1 | 10010010000100001 | 1 |
| 237 | 00100100100010100 | 1 | 00100100001000010 | 1 | 10001000010010010 | 1 | 01001000010010010 | 1 |
| 238 | 00100000000100010 | 1 | 00100100000100010 | 1 | 10001000010010001 | 1 | 10010000100100010 | 1 |
| 239 | 00100000000010010 | 1 | 00100001000000010 | 1 | 10010001000001000 | 3 | 10010000010000100 | 3 |

FIG.8a-15

| | $v_1$ | | $v_2$ | | $v_3$ | | $v_4$ | |
|---|---|---|---|---|---|---|---|---|
| 240 | 0010010000001001 | 1 | 0100100010000100 | 1 | 0010010000001001 | 3 | 0100100010000100 | 3 |
| 241 | 0010010000100001 | 1 | 0010000100000001 | 1 | 1001000010000100 | 1 | 1010000010000100 | 2 |
| 242 | 0001001010000010 | 1 | 0001001000010010 | 1 | 1000000010000000 | 1 | 1000000010000000 | 4 |
| 243 | 0001001001000010 | 1 | 0001001000000010 | 1 | 1000100001001001 | 1 | 1000100001001001 | 1 |
| 244 | 0001001010000001 | 1 | 0100100010000001 | 1 | 0010010000001001 | 1 | 0100100000100001 | 1 |
| 245 | 0001001000010001 | 1 | 0001000001000001 | 1 | 0001000010000010 | 1 | 1000100000100010 | 1 |
| 246 | 0000100100010010 | 1 | 0001001010000010 | 1 | 0001000000010001 | 1 | 0001000000010001 | 1 |
| 247 | 0001000100000010 | 1 | 0000100010000010 | 1 | 1000100000010010 | 1 | 1000100000010010 | 1 |
| 248 | 0001000010001001 | 1 | 0100100100010001 | 1 | 0000100010001001 | 1 | 0100100000001001 | 1 |
| 249 | 0000100001000001 | 1 | 0000100010000001 | 1 | 1000001001000001 | 1 | 1000001010000001 | 1 |
| 250 | 0000100100010010 | 1 | 0000100100010010 | 1 | 1000001000000010 | 1 | 1000001000000010 | 1 |
| 251 | 0000100010010010 | 1 | 0000100001000010 | 1 | 1000000100000001 | 1 | 0100000100000001 | 1 |
| 252 | 0000100010001001 | 1 | 0100000100001001 | 1 | 0000010010001001 | 1 | 0100100000100010 | 1 |
| 253 | 0000100100100001 | 1 | 0000100010000001 | 1 | 0100100010001001 | 1 | 0100100010001001 | 1 |
| 254 | 0000100001001000 | 2 | 0100001010001000 | 2 | 1000100000010000 | 1 | 0100100010000001 | 2 |
| 255 | 0000001000001000 | 2 | 0100001000010010 | 2 | 1000100100010000 | 1 | 0100001000010010 | 2 |

FIG.8a-16

| | $v_1$ | | $v_2$ | | $v_3$ | | $v_4$ | |
|---|---|---|---|---|---|---|---|---|
| 0 | 0000010010000000 | 4 | 0000010010000000 | 4 | 0100100001001000 | 2 | 0100100001001000 | 2 |
| 1 | 0000100100000000 | 4 | 0000010010000000 | 4 | 0100100001001000 | 3 | 0100100001001000 | 3 |
| 2 | 0001001010000000 | 4 | 0001001000000000 | 4 | 0100100000001001 | 1 | 0100100000001001 | 1 |
| 3 | 0000010010000000 | 4 | 0100100000000000 | 1 | 1000010000000000 | 4 | 0100100000000010 | 1 |
| 4 | 0000010010100000 | 3 | 0100100000000000 | 1 | 1000100000000100 | 3 | 0100100000000001 | 1 |
| 5 | 0000000010010000 | 3 | 0100010010000000 | 3 | 1001000000100100 | 3 | 0100100000000100 | 4 |
| 6 | 0000000010001000 | 3 | 0100010000001000 | 3 | 1001000000000100 | 3 | 0100100001000100 | 2 |
| 7 | 0000000010001000 | 2 | 0100100000001000 | 2 | 1001000000101000 | 2 | 0100100001000000 | 4 |
| 8 | 0000000001001000 | 2 | 0100100000001000 | 2 | 1001000000100100 | 2 | 0100100000000000 | 3 |
| 9 | 0000000010100000 | 2 | 0100010010010000 | 3 | 1001000001001000 | 4 | 0100100000010000 | 2 |
| 10 | 0000010001000000 | 4 | 0000010010000000 | 4 | 1001001010000000 | 3 | 0100100101000000 | 4 |
| 11 | 0000100000100000 | 4 | 0000100000100000 | 4 | 1000100001001000 | 3 | 1000100001001000 | 3 |
| 12 | 0000100100000000 | 4 | 0001000100000000 | 4 | 0100100001001000 | 3 | 1000100001001000 | 3 |
| 13 | 0010001000000000 | 4 | 0010100100000000 | 3 | 1001000000000100 | 3 | 0100100000000100 | 3 |
| 14 | 0000001000100000 | 3 | 0100100000000100 | 3 | 1000100001001000 | 3 | 0100100000000100 | 3 |
| 15 | 0000000100010000 | 3 | 0100100000010000 | 2 | 1001001000100000 | 3 | 0100100000010000 | 2 |

FIG. 8b-1

| | $v_1$ | | $v_2$ | | $v_3$ | | $v_4$ | |
|---|---|---|---|---|---|---|---|---|
| 16 | 0000000010001000 | 3 | 0100001000000001 | 1 | 0100100000001000 | 3 | 0100001000000001 | 1 |
| 17 | 0000000001000100 | 3 | 0100010000000010 | 1 | 0100100010001000 | 3 | 0100100000000010 | 1 |
| 18 | 0000000001000100 | 2 | 0100100000100100 | 3 | 1001000010010000 | 2 | 0100100000100100 | 3 |
| 19 | 0000000010001000 | 2 | 0100100100100000 | 3 | 1001001001100000 | 2 | 0100100100100000 | 3 |
| 20 | 0000001000100000 | 2 | 0100100100100000 | 2 | 0100100010010000 | 2 | 0100100100100000 | 2 |
| 21 | 0000010010000000 | 2 | 0100100000010010 | 1 | 0100100000001000 | 2 | 0100100000010010 | 2 |
| 22 | 0000100010010000 | 1 | 0000100010010000 | 1 | 1000100000100100 | 3 | 0100100000100100 | 1 |
| 23 | 0000100010000000 | 1 | 0000100100000001 | 1 | 1000100100100000 | 3 | 1000100100100000 | 3 |
| 24 | 0001001010000000 | 1 | 0001001000000001 | 1 | 0100100100010000 | 2 | 1000100100010000 | 2 |
| 25 | 0010010000000001 | 1 | 0010010000000001 | 1 | 1000100000100100 | 2 | 0100100010001000 | 2 |
| 26 | 0100100000001001 | 1 | 0100100000000100 | 3 | 1000100000000001 | 1 | 0100100000000100 | 3 |
| 27 | 0000001010010001 | 1 | 0100000100000001 | 1 | 1000100000000010 | 1 | 0100000100000001 | 1 |
| 28 | 0000000100100001 | 1 | 0100010000000100 | 2 | 1001000000001001 | 1 | 0100100000000100 | 2 |
| 29 | 0000010010100000 | 1 | 0100010001000000 | 1 | 1001000000010010 | 1 | 0100100000000010 | 1 |
| 30 | 0000100001000000 | 4 | 0000100001000000 | 4 | 1000100001100100 | 2 | 0100100000100100 | 2 |
| 31 | 0001000010000000 | 4 | 0001000010000000 | 4 | 1000100001001000 | 2 | 1000100001001000 | 2 |

FIG. 8b-2

|    | $v_1$ |   | $v_2$ |   | $v_3$ |   | $v_4$ |   |
|----|-------|---|-------|---|-------|---|-------|---|
| 32 | 00100000100000000 | 4 | 00100000100000000 | 4 | 01000100000001001 | 1 | 01000100000001001 | 1 |
| 33 | 00000100000100000 | 3 | 00000100000100000 | 3 | 01001000001001001 | 1 | 01001000001001001 | 1 |
| 34 | 00000010000010000 | 3 | 01000100000010010 | 3 | 10000100100100000 | 3 | 01001000000010010 | 1 |
| 35 | 00000001000001000 | 3 | 01001000000010001 | 1 | 10010000000001000 | 3 | 01001000000010001 | 1 |
| 36 | 00000000100000100 | 3 | 01000000010000000 | 4 | 10010000001000100 | 3 | 10000010000010000 | 4 |
| 37 | 00000001000100000 | 2 | 01000010000100000 | 2 | 10000100100000001 | 1 | 10000010000000001 | 1 |
| 38 | 00000000010000100 | 2 | 01000100010000100 | 3 | 10001000100100000 | 2 | 01000010000100100 | 3 |
| 39 | 00000000100001000 | 2 | 01000100000100100 | 2 | 10001000100100000 | 2 | 01000010000100100 | 2 |
| 40 | 00000100000001000 | 2 | 01000100000100010 | 1 | 10001000000000010 | 1 | 01000100000100010 | 1 |
| 41 | 00000001000010000 | 1 | 00000100001000001 | 1 | 10000100000001000 | 1 | 10000100000000000 | 4 |
| 42 | 00001000100000010 | 1 | 00001000100000010 | 1 | 10001000010000100 | 1 | 10001000010000100 | 2 |
| 43 | 00001000010000001 | 1 | 00001000010000001 | 1 | 10010000001001001 | 1 | 10010000001000100 | 1 |
| 44 | 00001000100000010 | 1 | 00001000100000010 | 1 | 10001000001001000 | 1 | 10001000001001000 | 3 |
| 45 | 00001000100000001 | 1 | 00001000100000001 | 1 | 10010001000010000 | 1 | 10010001000010000 | 3 |
| 46 | 00001001000000010 | 1 | 00001001000000010 | 1 | 10010001000010000 | 1 | 10010001000010000 | 3 |

FIG. 8b-3

| | $v_1$ | | $v_2$ | | $v_3$ | | $v_4$ | |
|---|---|---|---|---|---|---|---|---|
| 47 | 001000100000001 | 1 | 001000100000001 | 1 | 100010000010010 | 1 | 100010000010010 | 1 |
| 48 | 001001000000010 | 1 | 001001000000010 | 1 | 010001000001000 | 3 | 010001000001000 | 3 |
| 49 | 000000001000010 | 1 | 010010001010001 | 1 | 100100000010001 | 1 | 010010001010001 | 1 |
| 50 | 000000001000100 | 1 | 010010001000100 | 3 | 100100000100010 | 1 | 010010001000100 | 3 |
| 51 | 000000100010010 | 1 | 010000100010010 | 3 | 100100001001001 | 3 | 010000100010010 | 3 |
| 52 | 000000100010001 | 1 | 010001000010010 | 2 | 100100010010001 | 3 | 010001000010010 | 2 |
| 53 | 000000100100010 | 1 | 010001000010001 | 2 | 100100100100001 | 2 | 010001000010001 | 2 |
| 54 | 000001000100001 | 1 | 010001001000010 | 1 | 100100100100001 | 1 | 010001000100010 | 1 |
| 55 | 000001001000010 | 1 | 010001001000010 | 3 | 010001000001001 | 3 | 010001001000010 | 3 |
| 56 | 000100001000000 | 4 | 000100001000000 | 4 | 100100001000100 | 3 | 100100001000100 | 3 |
| 57 | 010000010000000 | 4 | 000100000100000 | 4 | 100100001000100 | 2 | 100100001000100 | 2 |
| 58 | 001001001010000 | 3 | 010100100010000 | 3 | 100100100001000 | 3 | 100100100001000 | 3 |
| 59 | 001001000001000 | 3 | 010010100001000 | 2 | 010010001001000 | 2 | 010010001001000 | 2 |
| 60 | 001001000100100 | 3 | 001001000100100 | 3 | 100100100100000 | 3 | 100100100100000 | 2 |

FIG.8b-4

|    | $v_1$ |   | $v_2$ |   | $v_3$ |   | $v_4$ |   |
|----|------|---|------|---|------|---|------|---|
| 61 | 00100010000000100 | 3 | 00100100000000100 | 3 | 01000010010001000 | 3 | 01000010010001000 | 2 |
| 62 | 00010010010001000 | 3 | 01000000010000001 | 3 | 00010010010001000 | 1 | 01000000010000001 | 1 |
| 63 | 00010010000100100 | 3 | 00010010001000100 | 3 | 01000010010001000 | 3 | 01000010010001000 | 3 |
| 64 | 00010010000000100 | 3 | 00010010000000100 | 3 | 01000010010001000 | 3 | 00010010010001000 | 3 |
| 65 | 00001001001001000 | 3 | 00001001001000100 | 3 | 01000010010001000 | 3 | 01001001001001000 | 3 |
| 66 | 00001001001000100 | 3 | 00001001001000100 | 3 | 01001001001000100 | 3 | 01001001001000100 | 3 |
| 67 | 00001001000100100 | 3 | 00001001000000100 | 3 | 10001010000000100 | 3 | 10001010000000100 | 3 |
| 68 | 00001001000000100 | 3 | 00001001010000100 | 3 | 10001010010000100 | 3 | 10001010010000100 | 3 |
| 69 | 00001001000010100 | 3 | 00001001000010100 | 3 | 10001001001001000 | 3 | 10001001001001000 | 3 |
| 70 | 00000100010000100 | 3 | 00000100010000100 | 2 | 10001001000000100 | 2 | 10001001000000100 | 2 |
| 71 | 00000100100001000 | 3 | 01001001001001000 | 3 | 10001001001001000 | 3 | 01001001010000100 | 3 |
| 72 | 00000000010010100 | 3 | 01001001010000100 | 3 | 10001001000010000 | 3 | 01001001000010000 | 3 |
| 73 | 00000000100000100 | 3 | 01001001000100100 | 3 | 10010000000010000 | 3 | 01001000000100100 | 3 |

FIG.8b-5

| | $v_1$ | | $v_2$ | | $v_3$ | | $v_4$ | |
|---|---|---|---|---|---|---|---|---|
| 74 | 000001000000010000 | 2 | 000001000000010000 | 2 | 100010000010000100 | 3 | 100010000010000100 | 3 |
| 75 | 000100100010001000 | 2 | 010000100010000100 | 3 | 100010010010001000 | 2 | 010000100010000100 | 3 |
| 76 | 000001000100000100 | 2 | 000000100010010000 | 2 | 000100100010001000 | 2 | 000100100010000100 | 2 |
| 77 | 000100100000100000 | 2 | 000010001001000100 | 2 | 010000100010001000 | 2 | 010000100010001000 | 2 |
| 78 | 001001000100010000 | 2 | 000100000010000010 | 1 | 001001000100001000 | 2 | 001000100100001000 | 2 |
| 79 | 000100100100000100 | 2 | 000010001001000100 | 2 | 010010010010001000 | 2 | 010010010010001000 | 2 |
| 80 | 000100100010000100 | 2 | 000100100010000100 | 2 | 100010000010000100 | 2 | 100010000010000100 | 2 |
| 81 | 000100100010000100 | 2 | 001010010000000100 | 2 | 100010000010000100 | 2 | 100010000010000100 | 2 |
| 82 | 000100100000100100 | 2 | 000100100010001000 | 2 | 100010000010001000 | 2 | 100010001000100000 | 2 |
| 83 | 001001000100100100 | 2 | 001001000100100100 | 2 | 010010010001010000 | 2 | 100010001000010000 | 2 |
| 84 | 001001000010000100 | 2 | 001001000100000100 | 2 | 100010000010001000 | 2 | 100010000010001000 | 2 |
| 85 | 001001000100010000 | 2 | 001001000010001000 | 1 | 010001001001001001 | 1 | 010000100010001001 | 1 |
| 86 | 000000000100000100 | 2 | 010000100010000100 | 2 | 100010001001000100 | 2 | 010000100010000100 | 2 |
| 87 | 000000010100100100 | 2 | 010001000100100100 | 2 | 100010000010001000 | 2 | 010000100010000100 | 2 |

FIG.8b-6

METHOD OF CONVERTING A SERIES OF M-BIT INFORMATION WORDS TO A MODULATED SIGNAL, METHOD OF PRODUCING A RECORD CARRIER, CODING DEVICE, DEVICE, RECORDING DEVICE, SIGNAL, AS WELL AS A RECORD CARRIER

BACKGROUND OF THE INVENTION

The invention relates to a method of converting a series of m-bit information words to a modulated signal, with m being an integer, in which method an n-bit code word is delivered for each received information word, with n being an integer exceeding m, and the delivered code words are converted to the modulated signal, and in which the series of information words is converted to a series of code words according to rules of conversion, so that the corresponding modulated signal satisfies a predetermined criterion, and in which the code words are spread over at least a group of a first type and at least a group of a second type, while the delivery of each of the code words belonging to the group of the first type establishes a first type of coding state determined by the associated group, the delivery of each of the code words belonging to the group of the second type establishes a second type of coding state determined by the associated group and by the information word associated to the delivered code word and, when one of the code words is assigned to the received information word this code word is selected from a set of code words that depends on the coding state established when the preceding code word was delivered, while the sets of code words belonging to the coding states of the second type do not contain any code words in common, in which the group of the second type comprises at least one codeword being associated with a plurality of information words among which the respective information word is distinguishable by detecting the respective set of which the following codeword is a member.

The invention further relates to a method for producing a record carrier on which a signal is recorded obtained according to said method.

The invention further relates to a coding device for performing the method as claimed, this device comprising an m-to-n bit converter for converting the m-bit information words to n-bit code words, and means for converting the n-bit code words to a modulated signal.

The invention further relates to a recording device in which a coding device of this type is used.

The invention further relates to a signal.

The invention further relates to a record carrier on which the signal is recorded.

Such methods, such devices, such a record carrier and such a signal are known from WO 95/22802 (corresponding to EP-A-94200387.2, PHN 14746). The document relates to a method of converting a series of m-bit information words to a modulated signal, the method being called EFM+. For each information word from the series an n-bit code word is delivered. The delivered code words are converted to a modulated signal. The code words are distributed over at least one group of a first type and at least one group of a second type. For the delivery of each of the code words belonging to the group of the first type the associated group establishes a coding state of the first type. When a code word belonging to the group of the second type is delivered, a coding state of the second type is established. A code word is assigned to the received information word selected from a set of code words which depends on the established coding state. The sets of code words belonging to the coding states of the second type are disjunct. The selected one of the possible coding sets of the second type is determined by the information word associated to the delivered code word. This allows several information words being associated with the same code word, the established coding state being different. In this coding method the number of unique bit combinations that may be used by the code words in the series is enlarged, thereby increasing the coding efficiency. The modulated signal thus obtained may be reconverted to information words by first converting the modulated signal to a series of code words and then assigning an information word to each of the code words from the series in dependence on the code word to be converted and also in dependence on the logical values of the bit string bits which are situated at predetermined positions relative to the code word, which logical values are indicative for the previously established coding state. Furthermore, a recording device and a reading device are disclosed.

The low frequency components of the modulated signal may interfere with other system parameters, such as servo signals in a recording system. Although the above converting method results in a modulated signal with a limited low frequency content, there still is a need to decrease the low frequency components.

SUMMARY OF THE INVENTION

Therefore it is an object of the invention to provide means for converting adapted for reducing the low-frequency content of the modulated signal.

According to a first aspect of the invention this object is achieved with a method as in the opening paragraph, characterized in that after establishing the first type of coding state a codeword is selected from the set belonging to the established coding state or from a set belonging to a different coding state of the first type while not violating the predetermined criterion in dependence of a low frequency content of the modulated signal.

According to further aspects of the invention this object is achieved with a signal, a record carrier, a coding device, a recording device and a method for producing a record carrier, as claimed in the claims 2 to 12. The measures according to the invention have the advantage, that the low frequency content (sometimes referred to as DC) of the modulated signal can be decreased, while keeping the same information coding efficiency.

BRIEF DESCRIPTION OF THE DRAWINGS

The invention will be further explained with reference to the drawing FIGS. 1 to 9, in which:

FIGS. 7 and 8 show tables in which the relation between the information words and code words is established;

DETAILED DESCRIPTION OF THE PREFERRED EMBODIMENTS

Figure 1:
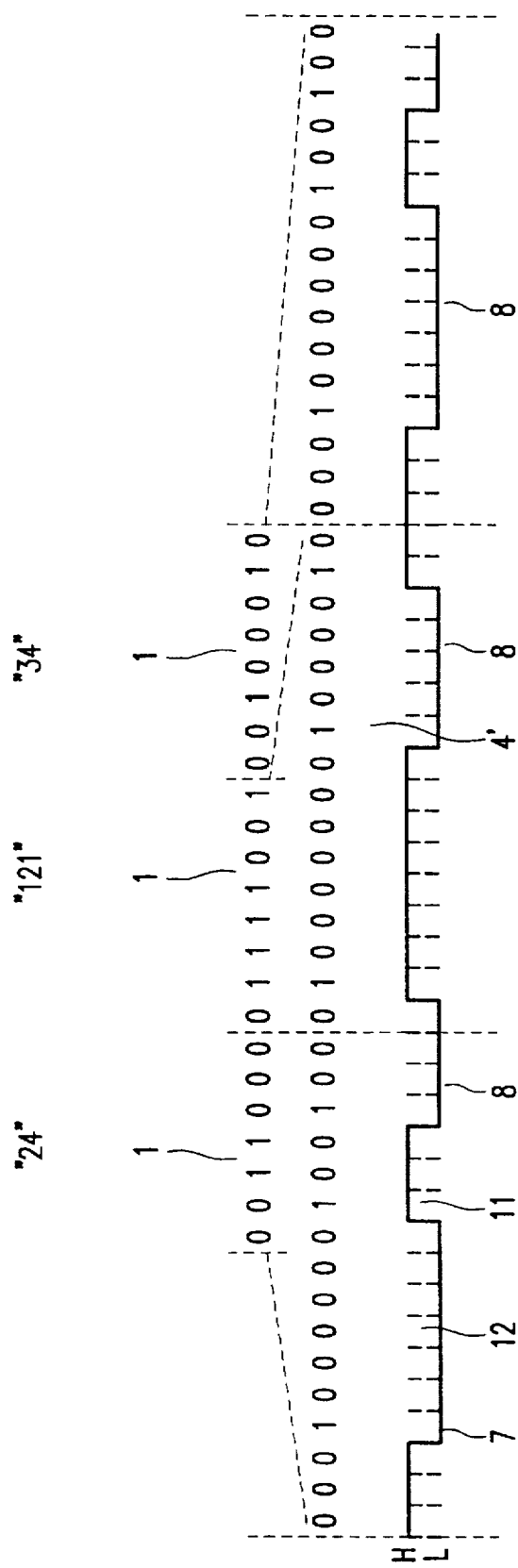
FIG. 1 shows a series of information words, a corresponding series of code words and a modulated signal.

FIG. 1 shows three consecutive m-bit information words, in this case, 8-bit information words referenced 1. Information about coding methods can be found in the book by K. A. Schouhamer Immink entitled "Coding Techniques for Digital Recorders" (ISBN 0-13-140047-9). In said title, for example, the so-called EFM modulation system is described which is used for recording information on so-called Compact Discs. The EFM-modulated signal is obtained by converting a series of 8-bit information words to a series of 14-bit code words, three merging bits being inserted into the code words. The code words are selected such that the minimum number of "0" bits situated between the "1" bits is d (2) and the maximum number is k (10). This constraint is also referenced dk-constraint. The series of code words is converted, via a modulo-2 integration operation, to a corresponding signal formed by bit cells having a high or low signal value, a "1"-bit being represented in the modulated signal by a change from the high to the low signal value or vice versa. A "0"-bit is represented by the lack of a change of signal value at a transition between two bit cells. The merging bits are selected such that even in the regions of transition between two code words the dk-constraint is satisfied and that in the corresponding signal the so-called running digital sum value remains substantially constant. The running digital sum value at a specific instant is understood to mean the difference between the number of bit cells having the high signal value and the number of bit cells having the low signal value, calculated over the modulated signal portion situated before this instant. A substantially constant running digital sum value means that the frequency spectrum of the signal does not comprise frequency components in the low frequency area. Such a signal is also referenced a DC-free signal. The lack of low-frequency components in the signal is highly advantageous when the signal is read from a record carrier on which the signal is recorded in the track, because then continuous tracking control unaffected by the recorded signal is possible. Information recording has a constant need for enhancing the information density on the record carrier. In FIG. 1 the three information words 1 have the respective word values "24", "121" and "34". This series of 3 information words 1 is converted to three consecutive n-bit code words, in this case, 16-bit code words referenced 4. The code words 4 form a bit string of bits having a logical "0" value and bits having a logical "1" value. The conversion of the information words is such that in the bit string the minimum number of bits having a logical "0" value positioned between two bits having a logical "1" value is d and the maximum is k, where d is equal to 2 and k is equal to 10. Such a bit string is often referenced a RLL string (RLL=Run Length Limited) with a dk-constraint. The individual bits of the code words will further be referenced x1, . . . , x16, where x1 denotes the first bit (from the left) of the code word and x16 denotes the last bit of the code word.

The bit string formed by the code words 4 is converted to a modulated signal 7 by means of a modulo-2 integration operation. This modulated signal comprises three information signal portions 8 representing the code words 4. The information signal portions comprise bit cells 11 which may have a high signal value H or a low signal value L. The number of bit cells per information signal portion is equal to the number of bits of the associated code word. Each code word bit having a logical "1" value is indicated in the modulated signal 7 by a transition from a bit cell having the high signal value to a bit cell having the low signal value, or vice versa. Each code word bit having the logical "0" value is indicated in the modulated signal 7 by the absence of a change of signal value at a bit cell transition.

Furthermore, the frequency spectrum of the modulated signal 7 is required to include substantially no low-frequency components. Worded differently, the modulated signal 7 is to be DC-free.

In the following an embodiment of the method according to the invention by which the modulated signal can be obtained will be described in detail.

First there is a requirement with respect to the code words that within the code words the dk-constraint is satisfied. The set of all the possible code words satisfying said dk-constraint is divided into at least group of a first type and at least a group of a second type. When a code word is delivered from one of the groups of the first type, a coding state is established which exclusively depends on the group of the first type to which the delivered code word belongs. When one of the code words of the group of the first type is delivered, a coding state is established which depends both on the group of the first type and on the information word represented by the delivered code word. In the embodiment described herein, two groups of the first type can be distinguished i.e. a first group G11 which comprises code words ending in a bits having a logical "0" value, where a is an integer equal to 0 or 1, and a second group G12 of code words ending in b bits having a logical "0" where with b is an integer smaller than or equal to 9 and greater than or equal to 6.

The coding state established by the first group G11 of the first type will henceforth be referenced S1. The coding state established by the second group G12 of the first type will henceforth be referenced S4. The embodiment to be described here only knows one group of the second type. This group comprises code words ending in c bits having a logical "0" value, where c is an integer greater than or equal to 2 and smaller than or equal to 5. This group will henceforth be referenced group G2. In the example to be described here, two coding states i.e. S2 and S3 can be established by the combination of a code word and associated information word.

When the information words are converted to code words, a code word belonging to a set of code words depending on the coding state is assigned to the information word to be converted. The sets of code words belonging to the coding states S1, S2, S3 and S4 will henceforth be referenced V1, V2, V3 and V4, respectively. The code words in the sets are selected such that each bit string that can be formed by a code word from the group that has established a coding state and an arbitrary code word from the set established by this coding state satisfies the dk-constraint. In the case where the coding state S4 is established by the delivery of the previously delivered code word and the coding state thus denotes that the previous code word ends in a bit string having a logical "0" value greater than or equal to 6 and smaller than or equal to 9, code word set V4 which is established by the coding state S4 is only allowed to comprise code words beginning with a maximum of 1 bit having the logical "0" value. For that matter, code words beginning with a larger number of bits having the logical "0" value will have transitional areas between the previously delivered code word and the code word to be delivered, in which areas the number of successive bits having the logical "0" value will not always be smaller than or equal to 10 and thus not satisfy the dk-constraint. For similar reasons, set V1 comprises only code words beginning with a number of bits having the logical "0" value that is greater than or equal to 2 and smaller than or equal to 9.

Sets V2 and V3 of code words belonging to the coding states S2 and S3 contain only code words beginning with a number of bits having a logical "0" value greater than or equal to 0 and smaller than or equal to 5. The code words satisfying this condition are spread over the two sets V2 and V3, so that sets V2 and V3 do not contain any common code words at all. Sets V2 and V3 will be referenced disjunct sets in the following. The spreading of the code words over sets V2 and V3 is preferably such that on the basis of the logical values of a limited number of p bits there can be determined to what set a code word belong. In the example described above, the bit combination x1.x13 is used for this purpose.

Code words from set V2 are recognisable from the bit combination x1.x13=0.0. Code words from set V3 are then recognisable from the combination x1.x13 which is unequal to 0.0. A distinction is made between code words establishing coding state S1 (group G11) on delivery, code words establishing coding state S2 or S3 (group G2) on delivery, and code words establishing the coding state S4 (group G12) on delivery. Set VI comprises 138 code words from group G11, 96 code words from group G2 and 22 code words from group G12.

It will be evident that the number of different code words in set VI is smaller than the number of different 8-bit information words.

Since the code words from group G2 are always followed by a code word from set V2 or a code word from set V3, and, in addition, based on the code word following a code word from group G2 there may be established what set this code word belongs to, a code word from group G2 followed by a code word from set V2 can be unequivocally distinguished from the same code word from group G2, but followed by a code word from set V3. Worded differently, when code words are assigned to an information word, each code word from group G2 can be used twice. Each code word from group G2 together with a random code word from set V2 forms a unique bit combination which is inseparable from the bit combination formed by the same code word and a random code word from the same set V3. This means that 138 unique bit combinations (code words) from group G11 can be used for set V1, 22 unique bit combinations (code words) from group G12 and 2*96 unique bit combinations (code words from group G2 combined with subsequent code words) from group G2. This brings the total number of useful unique bit combinations to 352. The number of unique bit combinations formed with the code words from sets V2, V3 and V4 are 352, 351 and 415, respectively.

Figure 2:
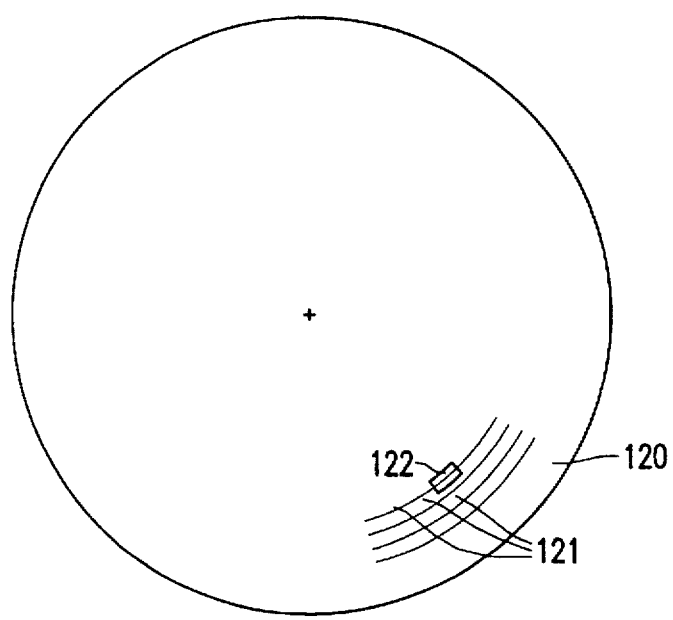
FIG. 2 shows a record carrier.
Figure 3:
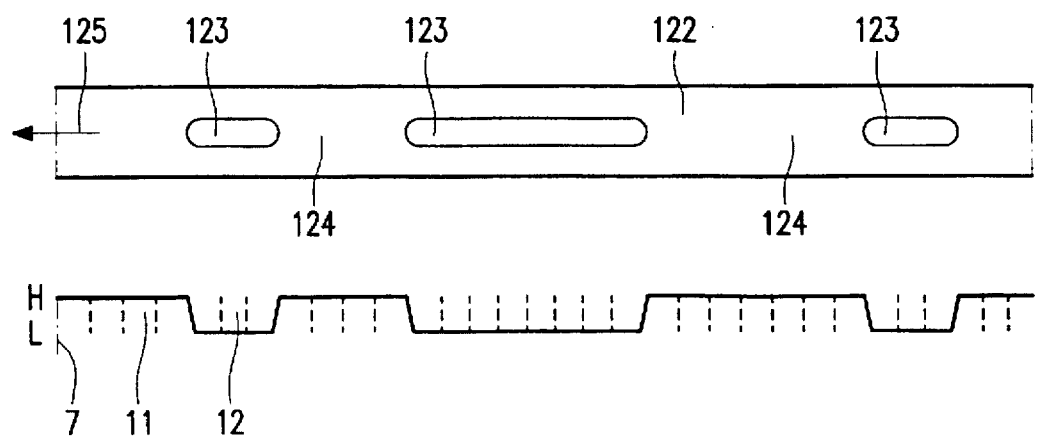
FIG. 3 shows a considerably enlarged portion of the record carrier of FIG. 2.

FIG. 2 shows by way of example, a record carrier 120 according to the invention. The record carrier shown is one of an optically detectable type. The record carrier may also be of a different type, for example, of a magnetically readable type. The record carrier comprises information patterns arranged in tracks 121. FIG. 3 shows a strongly enlarged portion 122 of one of the tracks 121. The information pattern in the track portion 121 shown in FIG. 3 comprises first sections 123, for example, in the form of optically detectable marks and second sections 124, for example, intermediate areas lying between the marks. The first and second sections alternate in a direction of the track 125. The first sections 123 present first detectable properties and the second sections 124 present second properties which are distinguishable from the first detectable properties. The first sections 123 represent bit cells 12 of the modulated binary signal 7 having one signal level, for example, the low signal level L. The second sections 124 represent bit cells 11 having the other signal level, for example, the high signal level H. The record carrier 12 may be obtained by first generating the modulated signal and then providing the record carrier with the information pattern. If the record carrier is of an optically detectable type, the record carrier can then be obtained with mastering and replica techniques known per se based on the modulated signal 7.

Figure 4:
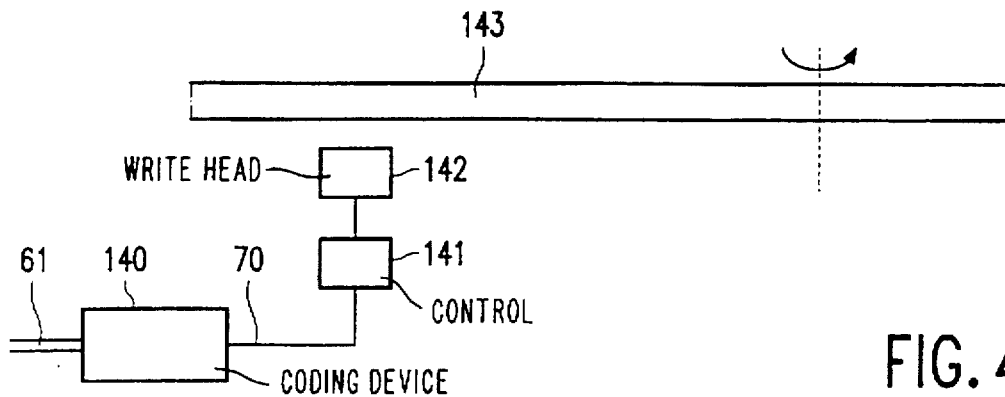
FIG. 4 shows a recording device.
Figure 6:
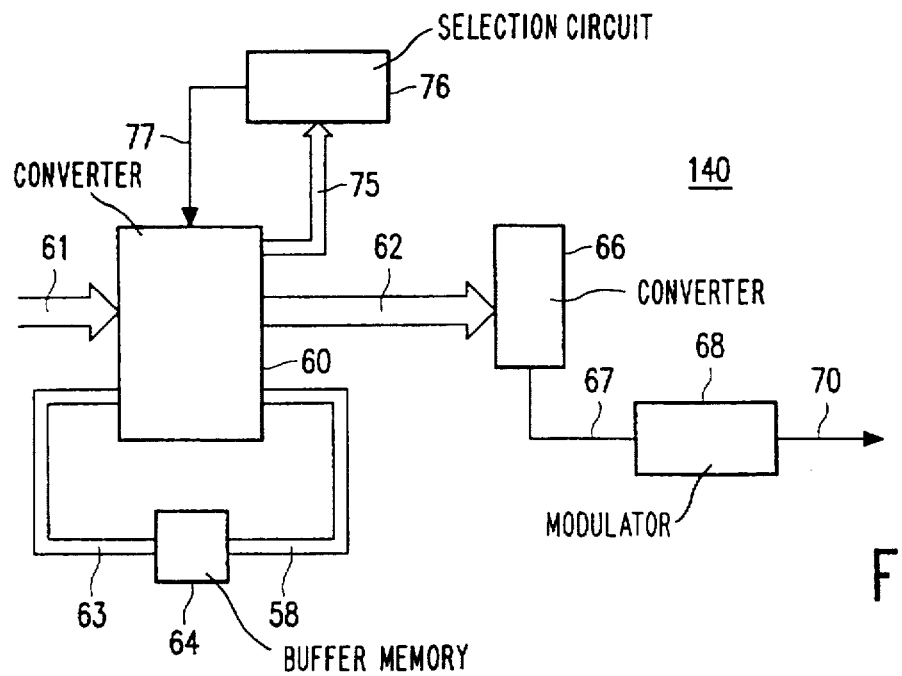
FIG. 6 shows a coding device.

FIG. 4 shows a recording device for recording information, in which the coding device according to the invention is used, for example, the coding device 140 shown in FIG. 6. In the recording device the signal line for delivering the modulated signal is connected to a control circuit 141 for a write head 142 along which a record carrier 143 of a writable type is moved. The write head 142 is of a customary type capable of introducing marks having detectable changes on the record carrier 143. The control circuit 141 may also be of a customary type generating a control signal for the write head in response to the modulated signal applied to the control circuit 141, so that the write head 142 introduces a pattern of marks that corresponds to the modulated signal.

Figure 5:
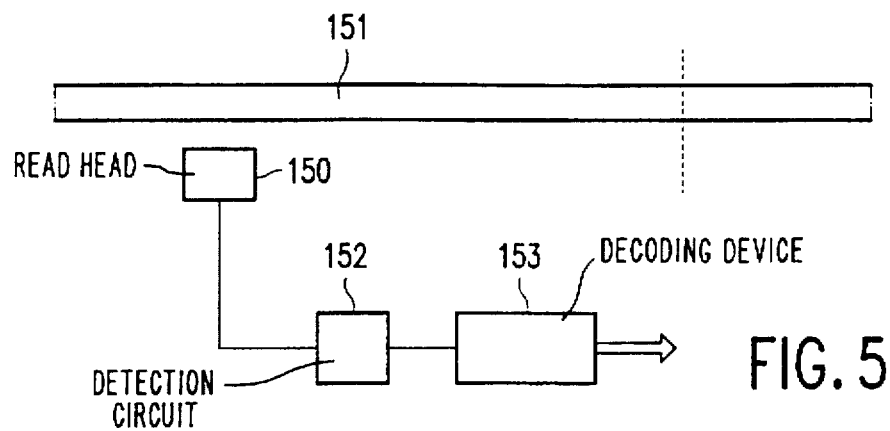
FIG. 5 shows a decoding and playback device.

FIG. 5 shows a reading device in which a decoding device according to the invention is used, for example, a decoding device 153 as described below. The reading device comprises a read head of a customary type for reading a record carrier according to the invention which record carrier carries an information pattern that corresponds to the modulated signal. The read head 150 then produces an analog read signal modulated according to the information pattern read out by the read head 150. Detection circuit 152 converts this read signal in customary fashion to a binary signal which is applied to the decoding circuit 153.

An embodiment of the decoding device 153 consists of a logic array that implements the inverse of the coding function. Using the coding tables as described with FIG. 7 words can be uniquely decoded by observing a 15 bit codeword, the two-tuple x1x3 formed by the 1st and 3rd bit of the upcoming codeword, and the number of zeros with which the previous codeword ended. In a formula (see encoding formula described later), the inverse function can be expressed as $$Bt=H^{-1}(Xt-1, Xt, Xt+1.x1, Xt+1.x3)$$

Note that observation of the 9 tail bits of the previous codeword Xt−1 is sufficient. From the above it can be seen that error propagation is limited to at most one byte. the logic array that translates (9+15+2) channel bits into 8 user bits can easily be reduced by exploiting a few properties of the code. The 2-bit look ahead is essentially one bit (indicating state 2 or 3) and the 9 bit look-back can be reduced to 2 bits (indicating states 1,2,3 or 4). Look-up is therefore required of (2+15+1) bits into 8 bits.

FIG. 6 shows an embodiment for a coding device 140 according to the invention by which the method described above can be carried out. The coding device is arranged for converting the m-bit information words 1 to the n-bit code words 4 and the number of different coding states can be indicated by s bits. The coding device comprises a converter 60 for converting (m+s+1) binary input signals to (n+s+t) binary output signals. From the inputs of the converter m inputs are connected to a bus 61 for receiving m-bit information words. From the outputs of the converter n outputs are connected to a bus 62 for delivering n-bit code words. Furthermore, s inputs are connected to an s-bit bus 63 for receiving a state word denoting the current coding state. A state word is delivered by a buffer memory 64, for example, in the form of s flip-flops. The buffer memory 64 has s inputs connected to a bus 58 for receiving a state word to be stored in the buffer memory. For delivering the state words to be stored in the buffer memory, s outputs of the converter 60 are used which are connected to bus 58.

Bus 62 is connected to the parallel inputs of a parallel-to-serial converter 66 which converts code words 4 received over bus 62 to a serial bit string to be supplied over a signal line 67 to a modulator circuit 68 which converts the bit string to the modulated signal 7 to be delivered over signal line 70. The modulator circuit 68 may be one of a customary type, for example, a so-termed modulo-2 integrator.

In addition to the code words and state words, the converter applies to a bus 75 or each received combination of information word and state word information which denotes whether for the associated state word the code word or a pair of code words is assigned to the associated information word, denotes for each of these assigned code words the change dDSV of the digital sum value caused by the code word as this change would be for a high signal value at the beginning of an information signal portion corresponding to this code word, denotes whether the number of "1" bits in the code word is odd or even.

For information transfer to a selection circuit 76 the bus 75 is connected to inputs of the selection circuit 76. The selection circuit calculates a running DSV for a portion of the modulated signal. This portion may start at a arbitrary point in the past or at a sync word. In another embodiment the DSV may also be calculated for a future portion, but in that case a memory is needed for temporarily storing the possible sequences of codewords.

Based on this information the selection circuit 76 delivers a selection signal which indicates whether the code word to be fed to the bus 62 with the presented information word has to increase or decrease the DSV value. This selection signal is applied to the converter 60 over a signal line 77. Accordingly the information word is to be converted in accordance with the relations laid down in the tables of FIG. 8a, or in accordance with the relations laid down in the tables of FIG. 8b. Further according to the invention, the converter establishes if a selection from different coding states of the first type is possible. For the tables of FIG. 8 this may be applicable for the in for the actual codeword form other sets. For the actual codeword form other sets of the first type the converter 60 verifies, if the dk-constraint is complied with. If the dk-constraint is not violated, the word from the other set is selectable. In that case the selection of the set to use is based on the selection signal.

Figure 8A-1:
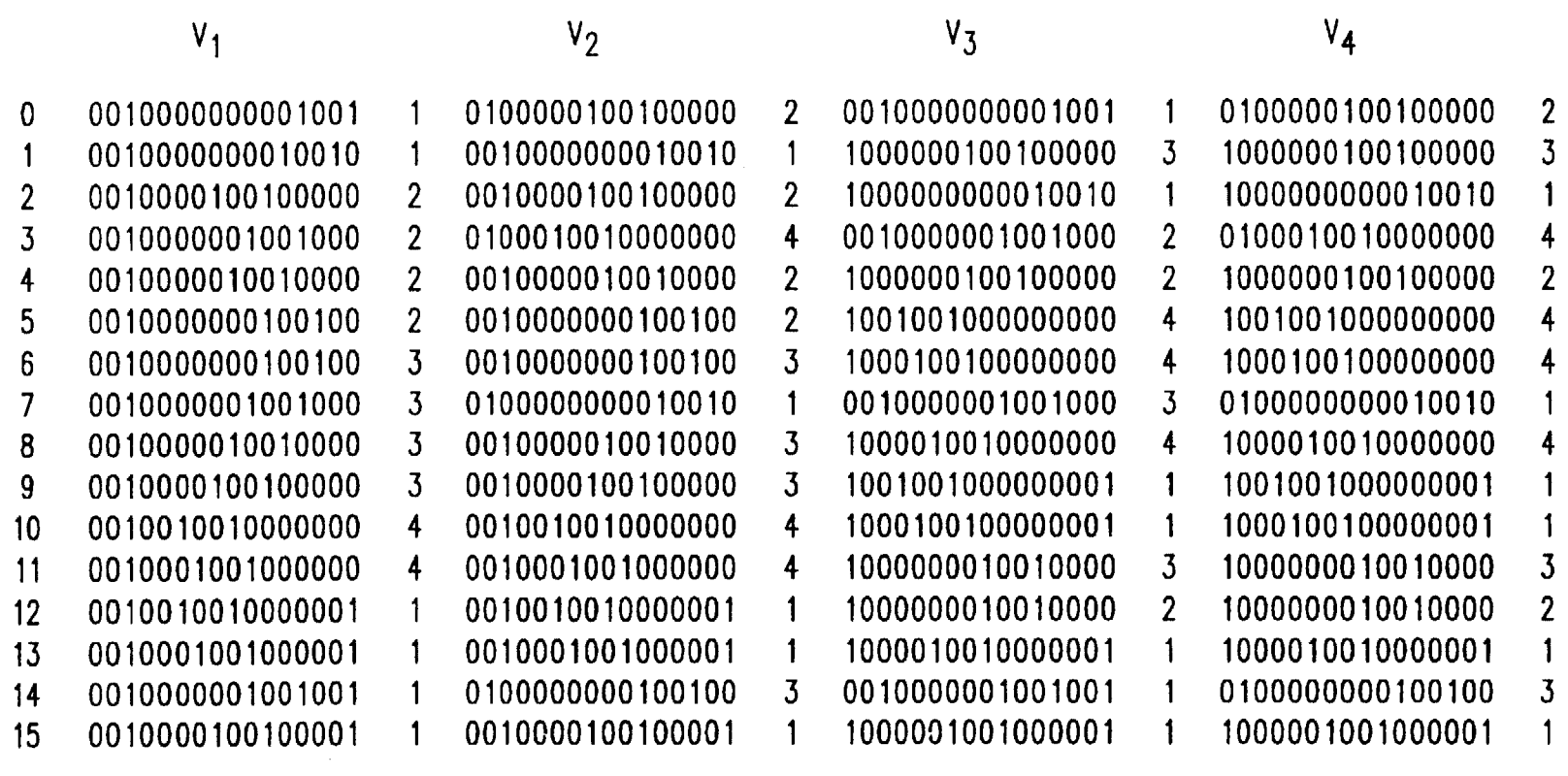

The converter 60 may comprise a ROM memory in which the code word tables shown in FIGS. 8a or 8b are stored at addresses determined by the combination of state word and information word applied to the inputs of the converter. In response to the detection signal, the addresses of the memory locations are selected with the code words corresponding to the table shown in FIG. 8a or the addresses of the memory locations with the code words corresponding to the table shown in FIG. 8b. A similar ROM memory may be used for a coding table from FIG. 7, which memory should then also comprise locations for the 'don't care' bits as indicated by x.

In the embodiment shown in FIG. 6 the state words are stored in memory 60. Alternatively, it is possible to derive, by a gate circuit, only the state words from the code words delivered to the bus 62.

FIG. 7 shows a coding table according to the invention. The parameters of this example are d=2, k=14, rate=8/15, the If contents are suppressed, the error propagation is limited to at most one byte. Further it has a unique 20 bit sync pattern and uses only 4 tables for encoding and decoding.

An encoder for this embodiment is a device with an 8-bit input, a 15 bit output, and an internal state which are functions of the (discrete) time. The principle of operation can be represented by a conventional finite state machine, a well known concept in the field of computation and automation theory. The encoder can be modeled with four states. We say that the states are connected by edges, and the edges, in turn, are labelled with tags called code words. A word in this embodiment is a 15 bit sequence that obeys the prescribed dk constraints. Each of the four states is characterized by the type of words that enter the given state as follows:

Words entering State 1 end with a 'one'

Words entering State 2 and 3 end with {2, . . . ,8} trailing 'zeros'

Words entering State 4 end with { 1,9 . . . ,11}trailing 'zeros'the words leaving the states are chosen in such a way that the concatenation of words entering a state and those leaving a state obey the dk-constraint. For example, words leaving state 1 start with a runlength of at least two zeros. Words emerging from state 2 and 3 comply with the above runlength constraints, but they also comply with the other constraints.

Words leaving state 3 have been selected such that the first (msb) bit x1, and the third bit x3 are both equal to zero. In a similar fashion, words leaving state 2 are characterized by the fact the two-tuple x1x3 does not equal 00. Obviously, the sets of words leaving state 2 or 3 have no words in common, that is, the two sets are disjoint. The attributes of the four states imply that any walk through a graph stepping from state to state, generates a dk constrained sequence by reading the words tagged to the edges that connect the states.

The encoder graph is defined in terms of three sets: the inputs, the outputs and the states, and two logical functions: the output function Ho and the next state function G( ).

The specific codeword, denoted by Xt, transmitted by the encoder at instant t is a function of the information word Bt that enters the encoder, but depends further on the particular state, St, of the encoder. Similarly, the next state at instant t+1 is a function of Bt and St. The output function H( ) and the next state function G( ) can be written as $$Xt=H(Bt,St)$$

$$St+1=G(Bt,St)$$

Both functions are described by four lists with 256 entries as shown in FIG. 7. The first column shows the information words 0–255. The second column gives the codewords for the State 1 and the third column gives the next coding state (indicated by 1,2,3 or 4). The further columns indicate the respective states S2, S3 and S4. The coding states S1 and S4 are of a first type as described in the EFM+document. The coding states S2 and S3 are of a second type. The words are written in NRZI notation. In the first 16 rows in FIG. 7 some bits are given as an 'x' (meaning don't care). This indicates, that for this bit position a 0 or 1 may be used. So two paired words are available for each information word, which differ only on one position. This degree of freedom must be used to minimize the LF content of the modulated signal, also indicated as DC control (DCC).

In the coding table of FIG. 7 words have been paired from information word 132 up to 255 in state S4 with the corresponding words in S1. As described with the DC control a word from S1 may be selected instead of the word of S4, while in coding state S4. For easy decoding the paired words in S1 should be no part of the set of S4. If common words are used in V1 and V4, the should be assigned to the same information word. This has the advantage, that a codeword can be uniquely decoded, without knowing the established state The DC control is possible in two different ways. Firstly, if the table shows a don't care in the output table, we may use this degree of freedom to optimize the running digital sum. Secondly, if the current state is s=4 and if the runlength constraints with the previous codeword Xt−1 allow so (that is if the juxtaposition of Xt−1 and H(Bt,1) do not violate the dk-constraint). In the embodiment shown in FIG. 7 an additional feature has been accomplished by the constraint that also G(Bt,1)=G(Bt,4). This results in the same codewords being generated consecutively to the current codeword. This has the advantage, that in a system where the decision which codeword to choose for DCC is postponed, the streams of possible sequences are differing only in one location (at the current codeword).

Figure 9:
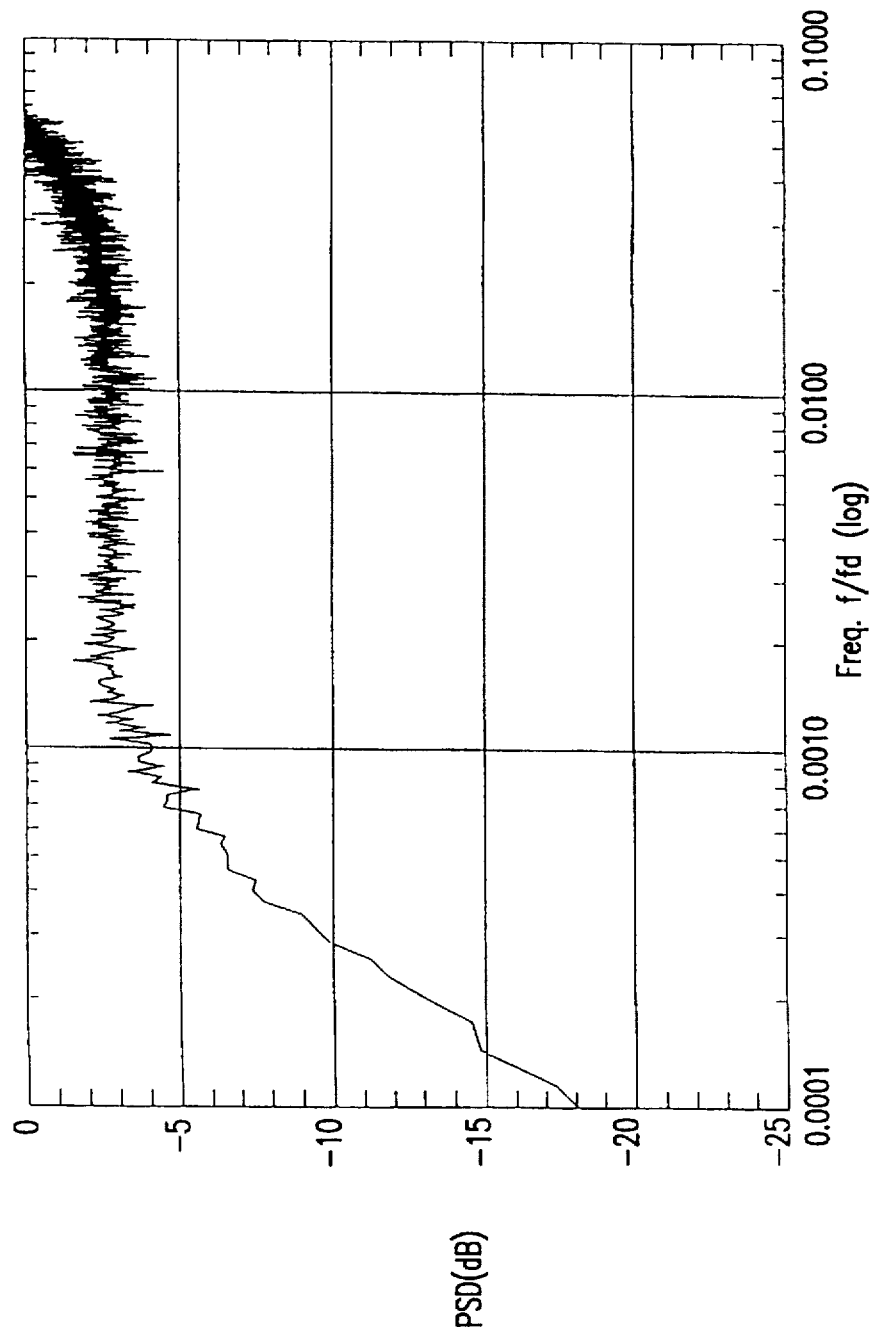
FIG. 9 shows the frequency spectrum of a modulated signal.

The eases the calculation and memory requirements for the DCC unit. The alternative stream is selected, that minimizes the running digital sum of the encoded sequence. The power spectral density of the embodiment is shown in FIG. 9.

A sync pattern is added to the modulated signal regularly. The definition of a unique and reliable pattern is a 20 bit sequence x0010 00000 00000 00001. Just before the sync pattern starts, the encoder is in a certain state, say s. The actual value of the msb of the sync pattern, denoted by x, is governed by s as follows. If s=2 the x is set to 1 else x=0. After transmission of the sync pattern the encoder is preset to State 1.

For other coding tables constructed under the similar constraints it will also be possible to use paired words from S4, while in coding state S1. However with the table of FIG. 7 no words can be used, because the d,k constraints will be violated. A different coding table, with a different number of coding states of the first type or a different assignment of code words or different word lengths m and n, can be constructed in which the degree of freedom of selecting freely one of the coding states of the first type by assigning paired words can be used to improve the low-frequency properties of the modulated signal.

FIG. 8 shows a coding table with rate 8/16. So m=8 and n=16, the dk-constraints are d=2, k=10. The columns are organized as in FIG. 7, but no x symbol is used for indicating a double word, but instead a main and a substitute table are given. FIG. 8a shows the main coding table and FIG. 8b shows a separate substitute table for the information words 0–87. The codewords of the substitute table may be selected for DC control, as described in the prior art EFM+document. In this embodiment, when in state 1 or 4, according to the invention a codeword may be selected from the other state of the first type, state 4 or 1 respectively. Further sync patterns may be added. The sync patterns have a unique pattern to distinguish them easily, for example a violation of the k constraint by including a series of k+1 zeros. After a sync pattern the state is reset to a predetermined value, for example state 1.

FIG. 9 shows the results of a computer simulation of the code of FIG. 7. The Power Spectral Density is calculated against the frequency, which is given as a ratio in relation to the bit frequency. A good LF performance for the 8/15 rate code is shown by the curve.

I claim:

1. A method of converting a series of m-bit information words to a modulated signal, with m being an integer, in which method an n-bit code word is delivered for each received information word, with n being an integer exceeding m, and the delivered code words are converted to the modulated signal, and in which the series of information words is converted to a series of code words according to rules of conversion, so that the corresponding modulated signal satisfies a predetermined criterion, and in which the code words are spread over at least a group of a first type and at least a group of a second type, while the delivery of each of the code words belonging to the group of the first type establishes a first type of coding state determined by the associated group, the delivery of each of the code words belonging to the group of the second type establishes a second type of coding state determined by the associated group and by the information word associated to the delivered code word and, when one of the code words is assigned to the received information word, this code word is selected from a set of code words that depends on the coding state established when the preceding code word was delivered, while the sets of code words belonging to the coding states of the second type do not contain any code words in common, in which the group of the second type comprises at least one codeword being associated with a plurality of information words among which the respective information word is distinguishable by detecting the respective set of which the following codeword is a member, characterized in that after establishing the first type of coding state a codeword is selected from the set belonging to the established coding state or from a set belonging to a different coding state of the first type while not violating the predetermined criterion in dependence of a low frequency content of the modulated signal.

2. The method as claimed in claim 1, characterized in that the modulated signal satisfies as the predetermined criterion that each number of successive bit cells having a same signal value is at least d+1 and at most k+1.

3. The method as claimed in claim 2, characterized in that d is equal to 2 and k is equal to 10.

4. The method as claimed in claim 1, characterized in that a running digital sum value is established as a measure for the low frequency content, which value is determined over a portion of the modulated signal and denotes for this portion the current value of a difference between the number of bit cells having a first value and the number of bit cells having a second value, while the selectable codewords have opposite effects on the digital sum value and the code word is selected so that the digital sum value continues to be limited.

5. The method as claimed in claim 1, characterized in that m is equal to 8 and n is equal to 16.

6. The method as claimed in claim 1, characterized in that codewords in sets belonging to a coding state of the first type and assigned to one information word establish the same coding state.

7. A coding device comprising an m-to-n bit converter for converting the m-bit information words to n-bit code words, and means for converting the n-bit code words to a modulated signal, and state establishing means for establishing a coding state on the delivery of a code word by the converter, the state establishing means being arranged for establishing a first type of coding state for each of the delivered code words belonging to a group of the first type which state is determined by the associated group, and for establishing a second type of coding state for each of the delivered code words belonging to a group of the second type which state is determined by the associated group and by the information word associated to the delivered code word, and the m-to-n-bit converter comprising means for selecting a code word corresponding to the information word from a set of code words that depends on the coding state, the sets of code words belonging to the coding states of the second type containing no code words in common, at least one code word of the group of the second type being associated with a plurality of information words among which the respective information word is distinguishable by detecting the respective set of which the following codeword is a member, characterized in that the device comprises means for selecting a codeword after establishing the first type of coding state from the set belonging to the established coding state or from a set belonging to a different coding state of the first type while not violating the predetermined criterion in dependence of a low frequency content of the modulated signal.

8. The coding device as claimed in claim 7, characterized in that the device comprises means for establishing a running digital sum value as a measure for the low frequency content, which value is determined over a portion of the modulated signal and denotes for this portion the current value of a difference between the number of bit cells having a first value and the number of bit cells having a second value, while the selectable codewords have opposite effects on the digital sum value and selecting the code word so that the digital sum value continues to be limited.

9. The device for recording information, which device comprises a coding device (140) as claimed in claim 7 or 8 for converting a series of information words representing the information to a modulated signal and means for recording on a record carrier (143) an information pattern corresponding to the signal.

10. The method for producing a record carrier in which the record carrier is provided with an information pattern representing a modulated signal generated by the method of converting a series of m-bit information words to a modulated signal, with m being an integer, in which method an n-bit code word is delivered for each received information word, with n being an integer exceeding m, and the delivered code words are converted to the modulated signal, and in which the series of information words is converted to a series of code words according to rules of conversion, so that the corresponding modulated signal satisfies a predetermined criterion, and in which the code words are spread over at least a group of a first type and at least a group of a second type, while the delivery of each of the code words belonging to the group of the first type establishes a first type of coding state determined by the associated group, the delivery of each of the code words belonging to the group of the second type establishes a second type of coding state determined by the associated group and by the information word associated to the delivered code word and, when one of the code words is assigned to the received information word, this code word is selected from a set of code words that depends on the coding state established when the preceding code word was delivered, while the sets of code words belonging to the coding states of the second type do not contain any code words in common, in which the group of the second type comprises at least one codeword being associated with a plurality of information words among which the respective information word is distinguishable by detecting the respective set of which the following codeword is a member, characterized in that after establishing the first type of coding state a codeword is selected from the set belonging to the established coding state or from a set belonging to a different coding state of the first type while not violating the predetermined criterion in dependence of a low frequency content of the modulated signal.

11. A signal comprising a sequence of successive information signal portions each representing an information word, in which signal each of the information signal portions comprises n bit cells having a first or second logical value, each information signal portion belonging to a predetermined group of information signal portions establishing a coding state of the first type and uniquely establishing an information word, each information signal portion belonging to a second group of information signal portions establishing a coding state of the second type and establishing in combination with a succeeding information signal portion a unique information word, the information signal portions being selected from a set of information signal portions belonging to the established coding state, at least one information signal portion of the second group being associated with a plurality of information words among which the respective information word is distinguishable by the logical value of at least one bit cell at a predetermined position in the succeeding information signal portion, characterized in that succeeding an information signal portion establishing the first type of coding state an information signal portion follows from the set belonging to the established coding state or from a set belonging to a different coding state of the first type in dependence of a low frequency content of the modulated signal.

12. A record carrier on which a signal comprising a sequence of successive information signal portions is recorded in a track in which information patterns represent the signal portions, which information patterns comprise first and second parts alternating in the direction of the track, the first parts present detectable properties and the second parts present second properties distinguishable from the first properties, and the parts having the first properties represent bit cells having the first logical value and the parts having the second properties represent the bit cells having the second logical value, the information signal portions each representing an information word, in which signal each of the information signal portions comprises n bit cells having a first or second logical value, each information signal portion belonging to a predetermined group of information signal portions establishing a coding state of the first type and uniquely establishing an information word, each information signal portion belonging to a second group of information signal portions establishing a coding state of the second type and establishing in combination with a succeeding information signal portion a unique information word, the information signal portions being selected from a set of information signal portions belonging to the established coding state, at least one information signal portion of the second group being associated with a plurality of information words among which the respective information word is distinguishable by the logical value of at least one bit cell at a predetermined position in the succeeding information signal portion, characterized in that succeeding an information signal portion establishing the first type of coding state an information signal portion follows from the set belonging to the established coding state or from a set belonging to a different coding state of the first type in dependence of a low frequency content of the modulated signal.

* * * * *